(12) United States Patent
Lee et al.

(10) Patent No.: US 12,237,319 B2
(45) Date of Patent: *Feb. 25, 2025

(54) STACKED-CHIP PACKAGES

(71) Applicant: Samsung Electronics Co., Ltd., Suwon-si (KR)

(72) Inventors: Daeho Lee, Hwaseong-si (KR); Taeje Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/418,964

(22) Filed: Jan. 22, 2024

(65) Prior Publication Data

US 2024/0203969 A1 Jun. 20, 2024

Related U.S. Application Data

(63) Continuation of application No. 17/368,028, filed on Jul. 6, 2021, now Pat. No. 11,923,351.

(30) Foreign Application Priority Data

Oct. 23, 2020 (KR) ........................ 10-2020-0138653

(51) Int. Cl.
*H01L 25/18* (2023.01)
*H01L 23/00* (2006.01)
*H01L 25/065* (2023.01)

(52) U.S. Cl.
CPC .............. *H01L 25/18* (2013.01); *H01L 24/08* (2013.01); *H01L 25/0657* (2013.01);
(Continued)

(58) Field of Classification Search
CPC ................. H01L 25/18; H01L 25/0657; H01L 2224/08146; H10B 12/50
See application file for complete search history.

(56) References Cited

U.S. PATENT DOCUMENTS 8,283,765 B2   10/2012   Kim
8,659,136 B2   2/2014   Youn et al.
(Continued)

FOREIGN PATENT DOCUMENTS

KR   10-2011-0012645 A   2/2011
KR      10-1678539 B1   11/2016

OTHER PUBLICATIONS

Extended European Search Report dated Mar. 30, 2022 for corresponding European Application No. 21201929.3.
(Continued)

*Primary Examiner* — Mamadou L Diallo
(74) *Attorney, Agent, or Firm* — Harness, Dickey & Pierce, P.L.C.

(57) ABSTRACT

A stacked-chip package of the inventive concepts includes a first chip and a second chip stacked on the first chip. The first chip may include a first cell array region, a first core circuit region including a first core terminal, and a first peripheral circuit region including a plurality of first peripheral circuit terminals. The second chip may include a second cell array region on the first cell array region, a second core circuit region on the first core circuit region and including a second core terminal, and a through via on the first peripheral circuit region and connected to at least one first peripheral circuit terminal of the plurality of first peripheral circuit terminals.

20 Claims, 22 Drawing Sheets

(52) U.S. Cl.
CPC ............... *H01L 2224/08146* (2013.01); *H01L 2225/06513* (2013.01); *H01L 2225/06541* (2013.01); *H01L 2924/1431* (2013.01); *H01L 2924/1436* (2013.01)

(56) References Cited

U.S. PATENT DOCUMENTS

| | | | |
|---|---|---|---|
| 8,791,562 B2 | 7/2014 | Lee et al. | |
| 9,184,137 B2 | 11/2015 | Lee | |
| 9,799,672 B2* | 10/2017 | Son | H01L 25/0657 |
| 2011/0109382 A1 | 5/2011 | Jin et al. | |
| 2011/0121433 A1* | 5/2011 | Kim | H01L 24/06 |
| | | | 257/737 |
| 2011/0156232 A1* | 6/2011 | Youn | H01L 23/3128 |
| | | | 257/E25.027 |
| 2012/0051113 A1 | 3/2012 | Choi et al. | |
| 2012/0112360 A1 | 5/2012 | Son | |
| 2013/0070507 A1* | 3/2013 | Yoon | G11C 7/1087 |
| | | | 365/189.011 |
| 2015/0108663 A1* | 4/2015 | Hong | H01L 23/5389 |
| | | | 257/777 |
| 2015/0279819 A1* | 10/2015 | Lee | H01L 23/13 |
| | | | 257/737 |
| 2017/0011976 A1* | 1/2017 | Park | G11C 29/1201 |
| 2017/0244030 A1* | 8/2017 | Park | H10N 70/841 |
| 2018/0233525 A1 | 8/2018 | Ikeda et al. | |
| 2019/0244878 A1 | 8/2019 | Kim et al. | |
| 2019/0372000 A1* | 12/2019 | Yu | H01L 23/3677 |
| 2020/0144225 A1 | 5/2020 | Koyanagi | |
| 2020/0176443 A1 | 6/2020 | Xiao et al. | |
| 2020/0185388 A1 | 6/2020 | Lu | |
| 2021/0066282 A1* | 3/2021 | Kim | H10B 43/40 |

OTHER PUBLICATIONS

Korean Office Action dated Oct. 31, 2024 for corresponding Korean Application No. 10-2020-0138653.

* cited by examiner

STACKED-CHIP PACKAGES

CROSS-REFERENCE TO RELATED APPLICATIONS

This application is a continuation of U.S. application Ser. No. 17/368,028, filed Jul. 6, 2021, which is based on and claims priority under 35 U.S.C. § 119 to Korean Patent Application No. 10-2020-0138653, filed on Oct. 23, 2020, in the Korean Intellectual Property Office, the disclosure of each of which is incorporated by reference herein in its entirety.

BACKGROUND

The technical idea of the inventive concepts relates to a stacked-chip package, and more particularly, to a stacked-chip package in which a chip size and a package size may be reduced.

A stacked-chip package in which a second chip is stacked on a first chip has been proposed. In order to increase the performance or capacity of the first chip or the second chip, the size of the first chip or the second chip is increasing. When the size of the first chip or the second chip increases, the package size of the stacked-chip package may also increase.

SUMMARY

A problem to be solved by the technical idea of the inventive concepts is to provide a stacked-chip package in which the package size may be reduced.

In order to solve the above problems, a stacked-chip package according to some example embodiments of the inventive concepts may include a first chip, and a second chip stacked on the first chip. The first chip may include a first cell array region, a first core circuit region including a first core terminal, and a first peripheral circuit region including a plurality of first peripheral circuit terminals. The second chip may include a second cell array region on the first cell array region, a second core circuit region on the first core circuit region and including a second core terminal, and a through via on the first peripheral circuit region and connected to at least one first peripheral circuit terminal of the plurality of first peripheral circuit terminals.

A stacked-chip package according to some example embodiments of the inventive concepts may include a first chip; and a second chip stacked on the first chip. The first chip may include a first substrate having a first surface and a second surface opposite to the first surface, a first cell array region on the first surface of the first substrate, a first core circuit region adjacent to the first cell array region and including a first core terminal, and a first peripheral circuit region adjacent to the first core circuit region and including a first peripheral circuit terminal. The second chip may include a second substrate having a third surface and a fourth surface opposite to the third surface, a second cell array region on the third surface of the second substrate and on the first cell array region, a second core circuit region on the first core circuit region and including the second core terminal, and a through via on the first peripheral circuit region, penetrating the second substrate, and electrically connected to the first peripheral circuit terminal.

A stacked-chip package according to some example embodiments of the inventive concepts may include a first chip; and a second chip stacked on the first chip. The first chip may include a first substrate having a first surface and a second surface opposite to the first surface, a first cell array region on the first surface of the first substrate, a first core circuit region adjacent to the first cell array region and including a first core terminal, a first peripheral circuit region adjacent to the first core circuit region and including a first peripheral circuit terminal, and a first through via penetrating the first substrate and connected to a first peripheral circuit terminal. The second chip may include a second substrate having a third surface and a fourth surface opposite to the third surface, a second cell array region on the third surface of the second substrate and on the first cell array region, a second core circuit region on the first core circuit region and including the second core terminal, and a second through via on the first peripheral circuit region and penetrating the second substrate and electrically connected to the first peripheral circuit terminal.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1:
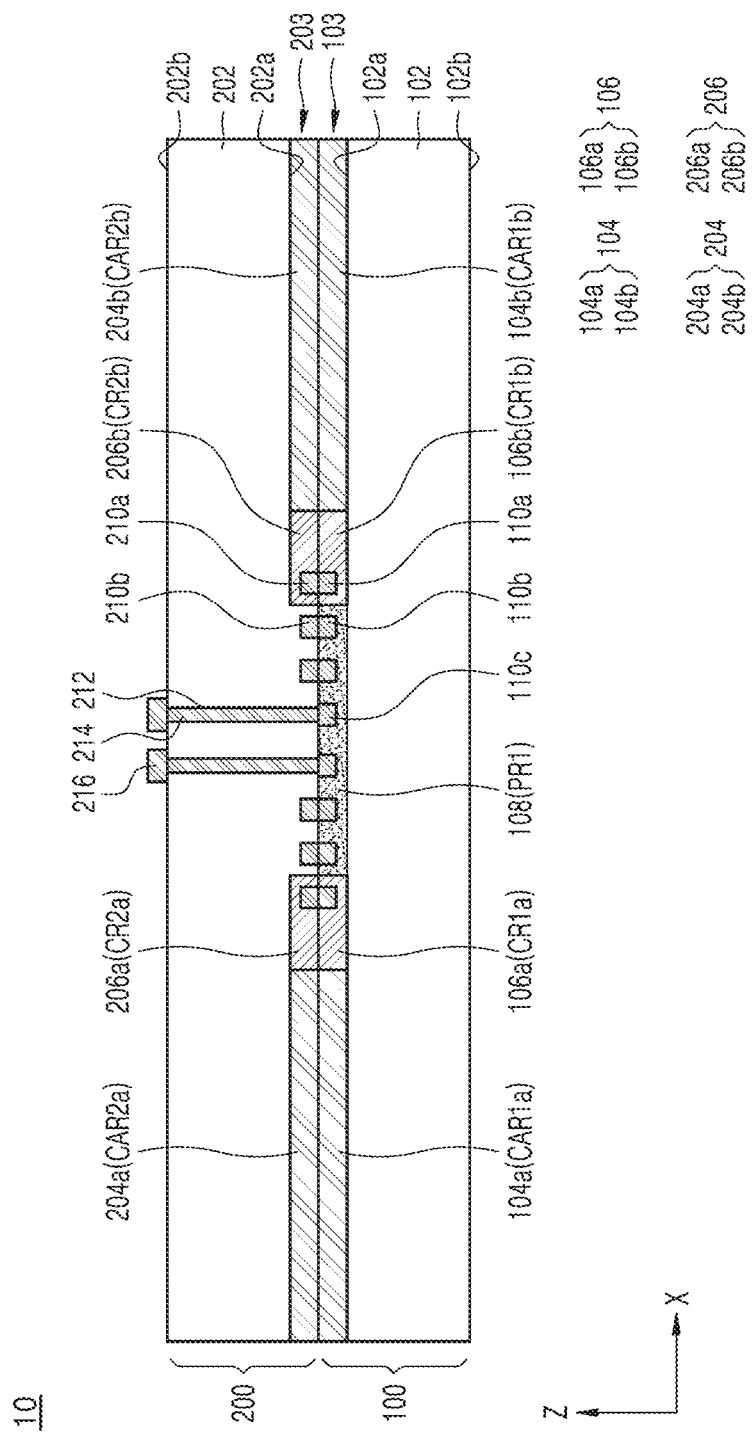
FIG. 1 is a cross-sectional view of a main part showing a stacked-chip package according to some example embodiments of the inventive concepts.

Hereinafter, some example embodiments of the inventive concepts will be described in detail with reference to the accompanying drawings. The following example embodiments of the inventive concepts may be implemented by only one, and the following example embodiments may be implemented by combining one or more. Therefore, the technical idea of the inventive concepts is not construed as being limited to one example embodiment.

As described herein, an element that is "on" another element may be above or beneath or adjacent (e.g., horizontally adjacent) to the other element. An element that is on another element may be directly on the other element, such that the element is in direct contact with the other element. An element that is on another element may be indirectly on the other element, such that the element is isolated from direct contact with the other element by one or more interposing spaces and/or structures.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%).

It will be understood that elements and/or properties thereof may be recited herein as being "the same" or "equal" as other elements, and it will be further understood that elements and/or properties thereof recited herein as being "identical" to, "the same" as, or "equal" to other elements may be "identical" to, "the same" as, or "equal" to or "substantially identical" to, "substantially the same" as or "substantially equal" to the other elements and/or properties thereof. Elements and/or properties thereof that are "substantially identical" to, "substantially the same" as or "substantially equal" to other elements and/or properties thereof will be understood to include elements and/or properties thereof that are identical to, the same as, or equal to the other elements and/or properties thereof within manufacturing tolerances and/or material tolerances. Elements and/or properties thereof that are identical or substantially identical to and/or the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same and/or identical encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

FIG. 1 is a cross-sectional view of a main part showing a stacked-chip package according to some example embodiments of the inventive concepts.

In detail, a stacked-chip package 10 may include a first chip 100 and a second chip 200 stacked on the first chip 100. In the stacked-chip package 10, a bonding layer (or a connection layer) may not be provided between the first chip 100 and the second chip 200 in a vertical direction, that is, in a Z direction. The first chip 100 and the second chip 200 may have the same width (or size). In other words, the first chip 100 and the second chip 200 may have the same width in a horizontal direction, for example, in an X direction.

The first chip 100 and the second chip 200 may be of the same type or different types. In the following example embodiments, the first chip 100 and the second chip 200 are described as a memory chip, for example, a DRAM chip, but the inventive concepts are not limited thereto. In the following example embodiments, the term "connection" may mean a physical connection and/or an electrical connection.

First, the first chip 100 of the stacked-chip package 10 will be described. The first chip 100 may include first cell array regions 104a and 104b, first core circuit regions 106a and 106b, and a first peripheral circuit region 108 formed on a first substrate 102. In other words, the first chip 100 may include the first cell array regions 104a and 104b, the first core circuit regions 106a and 106b, and the first peripheral circuit region 108 implemented on the first substrate 102.

The first core circuit regions 106a and 106b may be regions for sensing data or transmitting read and write signals of the first cell array regions 104a and 104b. The first peripheral circuit region 108 may control the first cell array regions 104a and 104b and the first core circuit regions 106a and 106b, and may receive and transmit data input/output signals. In addition, the first peripheral circuit region 108 may be electrically connected to the second chip 200 and shared by the first chip 100 and the second chip 200.

The first chip 100 may include the first substrate 102. The first substrate 102 may include a first surface 102a and a second surface 102b opposite to the first surface 102a. The first substrate 102 may be a silicon substrate. The first surface 102a may be a front surface or a surface, and the second surface 102b may be a back surface or a rear surface. The first surface 102a may be an active surface on which circuit elements are formed, and the second surface 102b may be a non-active surface on which no circuit elements are formed.

A first circuit element layer 103 including the first cell array regions 104a and 104b, the first core circuit regions 106a and 106b, and the first peripheral circuit region 108 is formed on the first surface 102a. The first peripheral circuit region 108 may be in a central portion of the first substrate 102.

In detail, first cell array regions 104a and 104b may be formed on (e.g., directly or indirectly on) the first surface 102a of the first substrate 102. The first cell array region 104a may include first cell array circuit CAR1a, and the first cell array region 104b may include first cell array circuit CAR1b. In FIG. 1, only two first cell array regions 104a and 104b constituting the first chip 100 are included, but there may be more. In some example embodiments, only one first cell array region (e.g., first cell array region 104a) may be included in the first chip 100.

The first cell array regions 104a and 104b may hereinafter be referred to as a first sub-cell array region 104a and a second sub-cell array region 104b. The first sub-cell array region 104a and the second sub-cell array region 104b may be apart from each other in the horizontal direction, that is, in the X direction. The horizontal direction may be a direction horizontal to the first surface 102a of the first substrate 102.

The first core circuit regions 106a and 106b may be formed on the first surface 102a of the first substrate 102. The first core circuit region 106a may include first core circuit CR1a, and the first core circuit region 106b may include first core circuit CR1b. The first core circuit region 106a may include a first sub-core circuit region 106a, and the first core circuit region 106b may include a second sub-core circuit region 106b. In some example embodiments, the first chip 100 may include only one first core circuit region 106a.

The first core circuit regions 106a and 106b may be formed adjacent to (e.g., directly or indirectly adjacent to) the first cell array regions 104a, and 104b. In other words, the first sub-core circuit region 106a may be formed adjacent to the first sub-cell array region 104a, and the second sub-core circuit region 106b may be formed adjacent to the second sub-cell array region 104b.

Each of the first core circuit regions 106a and 106b may include a first core terminal 110a. The first core terminal 110a may be an electrode terminal including a metal such as copper. The first core terminal 110a may be bonded to a second core terminal 210a of the second chip 200.

The first peripheral circuit region 108 may include a first peripheral circuit PR1. The first peripheral circuit region 108 may be formed adjacent to (e.g., directly or indirectly adjacent to) the first core circuit regions 106a and 106b. The first peripheral circuit region 108 may include one or more first peripheral circuit terminals 110b and 110c (e.g., a plurality of first peripheral circuit terminals). The first peripheral circuit terminals 110b and 110c may be electrode terminals including metal, for example, copper. The first peripheral circuit terminals 110b and 110c may be input/output terminals capable of receiving or transmitting an external signal from an external device, such as an external controller.

The first peripheral circuit terminals 110b and 110c may include a first connection terminal 110b and a through via connection terminal 110c. The first connection terminal 110b may be positioned away from (e.g., isolated from direct contact with) the through via connection terminal 110c. The first connection terminal 110b may not be connected to (e.g., may be isolated from direct contact with) the second through via 214. The first connection terminal 110b may be connected (or bonded) to a second connection terminal 210b of the second chip 200, and the through via connection terminal 110c may be connected (or bonded) to a second through via 214 of the second chip 200. The second connection terminal 210b is electrically connected to the second core terminal 210a so that the first peripheral circuit region 108 may be shared by the first chip 100 and the second chip 200.

Next, the second chip 200 of the stacked-chip package 10 will be described. The second chip 200 may include second cell array regions 204a and 204b, second core circuit regions 206a and 206b, a second through via 214, and a second pad 216 for external connection formed on a second substrate 202.

In other words, the second chip 200 may include the second cell array regions 204a and 204b, the second core circuit regions 206a and 206b, the second through via 214, and the second pad 216 for external connection implemented on the second substrate 202. The second core circuit regions 206a and 206b may be regions for sensing data or transmitting read and write signals of the second cell array regions 204a and 204b. In some example embodiments, the second chip 200 may not include a second peripheral circuit region. The first chip 100 and the second chip 200 may be connected to each other through the second through via 214 and share the first peripheral circuit region 108 as described above.

The second chip 200 may include a second substrate 202. The second substrate 202 may include a third surface 202a and a fourth surface 202b opposite to the third surface 202a. The second substrate 202 may be a silicon substrate. The third surface 202a may be a front surface or a surface, and the fourth surface 202b may be a back surface or a rear surface. The third surface 202a may be an active surface on which circuit elements are formed, and the fourth surface 202b may be a non-active surface on which circuit elements are not formed.

A second circuit element layer 203 including the second cell array regions 204a and 204b and the second core circuit regions 206a and 206b may be formed on the third surface 202a. The second circuit element layer 203 may contact the first circuit element layer 103. The second through via 214 and the second pad 216 for external connection may be in a central portion of the second substrate 202. The second through via 214 may be referred to as a second center through via. The second pad 216 for external connection may be referred to as a second center pad for external connection. Accordingly, as shown in FIG. 1, the first peripheral circuit region 108 may be located at a central portion of the first chip 100, the second through via 214 may be located at a central portion of the second chip 200, and the second pad 216 may be a center pad for external connection that is on the through via 214 located at the central portion of the second chip 200.

In detail, the second cell array regions 204a and 204b may be formed on the third surface 202a of the second substrate 202. The second cell array region 204a may include second cell array circuit CAR2a, and the second cell array region 204b may include second cell array circuit CAR2b. In FIG. 1, only two second cell array regions 204a and 204b constituting the second chip 200 are included, but there may be more. In some example embodiments, only one second cell array region (e.g., second cell array region 204a) may be included in the second chip 200.

The second cell array region 204a may be referred to as a third sub-cell array region 204a, and the second cell array region 204b may be referred to as a fourth sub-cell array region 204b. The third sub-cell array region 204a and the fourth sub-cell array region 204b may be apart from each other in the horizontal direction, that is, in the X direction. The horizontal direction may be a horizontal direction with respect to the third surface 202a of the second substrate 202.

The second cell array region 204a may be located on (e.g., directly on or indirectly on) the first cell array region 104a of the first chip 100, and the second cell array region 204b may be located on the first cell array region 104b of the first chip 100. The third sub-cell array region 204a and the fourth sub-cell array region 204b may be positioned on the first sub-cell array region 104a and the second sub-cell array region 104b, respectively.

The second core circuit regions 206a and 206b may be formed on the third surface 202a of the second substrate 202. The second core circuit region 206a may be located on the first core circuit region 106a of the first chip 100, and the second core circuit region 206b may be located on the first core circuit region 106b of the first chip 100. The second core circuit region 206a may include second core circuit CR2a, and the second core circuit region 206b may include second core circuit CR2b. The second core circuit region 206a may include a third sub-core circuit region 206a, and the second core circuit region 206b may include a fourth sub-core circuit region 206b.

The second core circuit regions 206a and 206b may be formed adjacent to the second cell array regions 204a and 204b. In other words, the third sub-core circuit region 206a may be formed adjacent to the third sub-cell array region 204a, and the fourth sub-core circuit region 206b may be formed adjacent to the fourth sub-cell array region 204b.

The second core circuit regions 206a and 206b may include the second core terminal 210a. The second core terminal 210a may be an electrode terminal including a metal such as copper. The second core terminal 210a may be bonded to the first core terminal 110a of the first chip 100. As described above, the second core terminal 210a may be electrically connected to the second connection terminal 210b. The second chip 200 and the first chip 100 may be bonded to each other through a state in which the third surface 202a (front) of the second chip 200 and the first surface 102a (front) of the first chip 100 face each other.

The second through via 214 and the second connection terminal 210b may be formed on the first peripheral circuit region 108 of the first chip 100. The second through via 214 may be formed in the second through hole 212 penetrating the second substrate 202 and thus the second through via 214 may penetrate the second substrate 202. The second through via 214 may be referred to as a second conductive via. When the second substrate 202 is a silicon substrate, the second through via 214 may be a through silicon via (TSV). As described above, because the second chip 200 does not include the second peripheral circuit region, the second through via 214 may not penetrate the second peripheral circuit region.

The second through via 214 penetrating the second substrate 202 may be connected to the through via connection terminal 110c of the first peripheral circuit terminals 110b and 110c of the first chip 100 and thus the second through via 214 may be understood to be connected to at least one first peripheral circuit terminal (e.g., through via connection terminal(s) 110c) of the plurality of first peripheral circuit terminals 110b and 110c. The second through via 214 is not formed in the first peripheral circuit region 108 of the first chip 100. The second through via 214 may be a single body connecting the second chip 200 to the first chip 100.

The second through via 214 may be a connection member connecting the second chip 200 to the first chip 100. The second connection terminal 210b may be connected (or bonded) to the first connection terminal 110b of the first chip 100. The second connection terminal 210b may be an electrode terminal including a metal such as copper.

The second chip 200 may include the second pad 216 for external connection to the second through via 214 on the fourth surface 202b of the second substrate 202. The second pad 216 for external connection may be used when an additional chip is stacked on the second chip 200.

In the stacked-chip package 10 as described above, the second chip 200 is stacked on the first chip 100 in a vertical direction, for example, in the Z direction. The first chip 100 includes the first peripheral circuit region 108 and a through via is not formed in the first peripheral circuit region 108.

The second chip 200 does not have a peripheral circuit region and includes the second through via 214 positioned on the first peripheral circuit region 108 of the first chip 100. When the second pad 216 for external connection formed on the second chip 200 is connected to a package substrate (not shown), the second chip 200 may be a master chip, and the first chip 100 may be a slave chip.

The stacked-chip package 10 configured as described above does not separately include a region in which a through via is formed in the first chip 100, and the second chip 200 does not separately include a peripheral circuit region.

Accordingly, the stacked-chip package 10 includes the first chip 100 and the second chip 200, but may operate as one chip. In addition, the sizes of the first chip 100 and the second chip 200 of the stacked-chip package 10 may be reduced, and accordingly, package size may be reduced.

Figure 2:
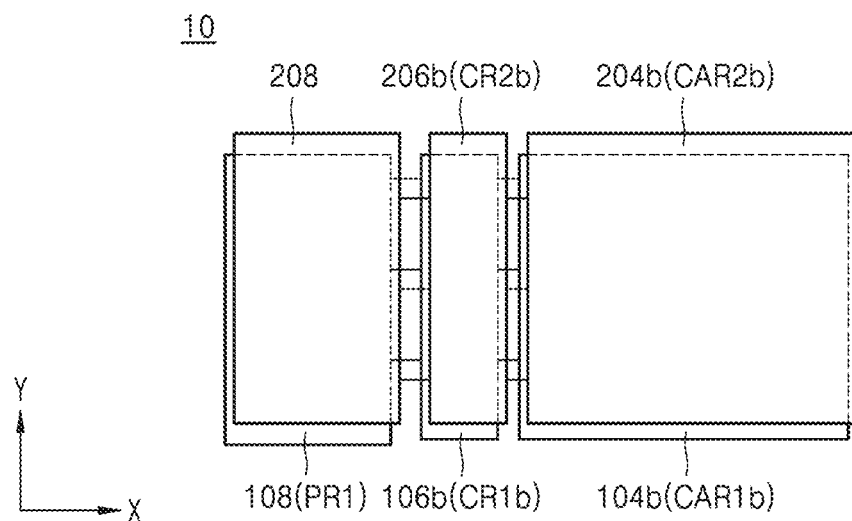
FIGS. 2, 3, and 4 are partial plan layout diagrams for describing the stacked-chip package of FIG. 1.
Figure 3:
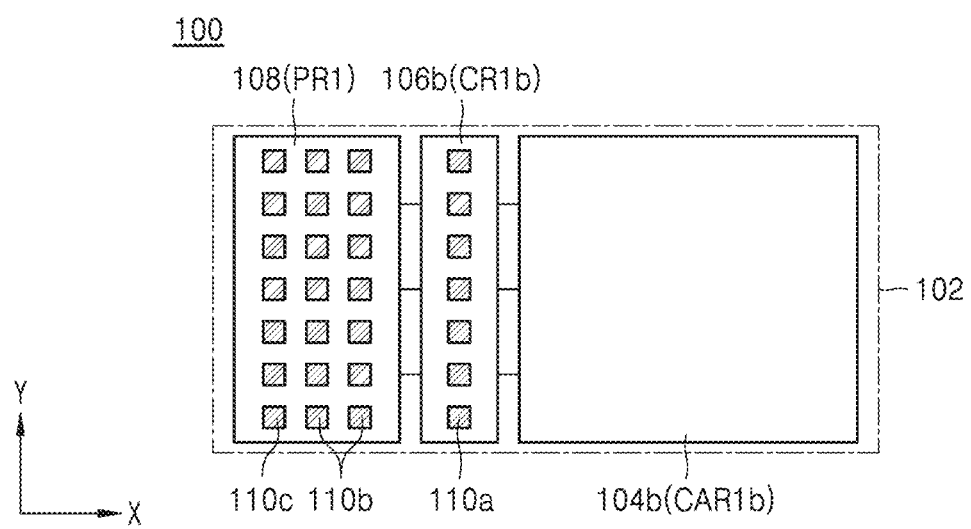
Figure 4:
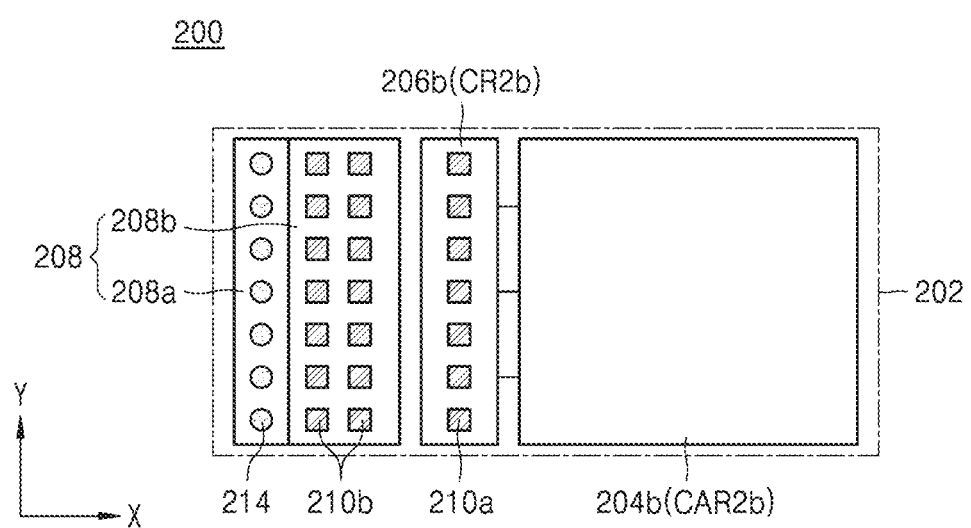

FIGS. 2, 3, and 4 are partial plan layout diagrams for describing the stacked-chip package of FIG. 1.

In detail, FIGS. 2 to 4 may be plan layout diagrams of a right portion of FIG. 1. FIG. 2 is a partial plan layout diagram of the stacked-chip package 10 of FIG. 1, FIG. 3 is a partial plan layout view of the first chip 100 of FIG. 1, and FIG. 4 is a partial plan layout diagram of the second chip 200 of FIG. 1.

As shown in FIGS. 2 and 3, the first chip 100 may include the first peripheral circuit region 108, the first core circuit region 106b, and the first cell array region 104b. The first peripheral circuit region 108 may be disposed on the first substrate 102. The first peripheral circuit region 108 may include the first peripheral circuit PR1. The first peripheral circuit region 108 may include first peripheral circuit terminals 110b and 110c.

The first core circuit region 106b may be adjacent to one side of the first peripheral circuit region 108. The first core terminal 110a may be disposed in the first core circuit region 106b. The first cell array region 104b may be adjacent to one side of the first core circuit region 106b. The first cell array region 104b may include a first cell array circuit CAR1b.

As shown FIGS. 2 and 4, the second chip 200 may include an additional region 208, a second core circuit region 206b, and a second cell array region 204b. The additional region 208 may be disposed on the second substrate 202 to correspond to the first peripheral circuit region 108. The additional region 208 may include a through via region 208a in which the second through via 214 is formed and a second connection terminal region 208b in which the second connection terminal 210b is formed.

The second core circuit region 206b may be positioned adjacent to one side of the additional region 208 and corresponding to the first core circuit region 106b. A second core circuit CR2b and the second core terminal 210a may be disposed in the second core circuit region 206b. The second cell array region 204b corresponding to the first cell array region 104b may be adjacent to one side of the second core circuit region 206b. The second cell array region 204b may include a second cell array circuit CAR2b.

In the stacked-chip package 10 configured as described above, the first chip 100 includes a first peripheral circuit region in which a through via region is not separately provided and a through via is not formed. The second chip 200 does not have a peripheral circuit region and only the through via region 208a is disposed in a part of the additional region 208. Accordingly, the sizes of the first chip 100 and the second chip of the stacked-chip package 10 may be reduced, and accordingly, the size of the package may be reduced.

Figure 5:
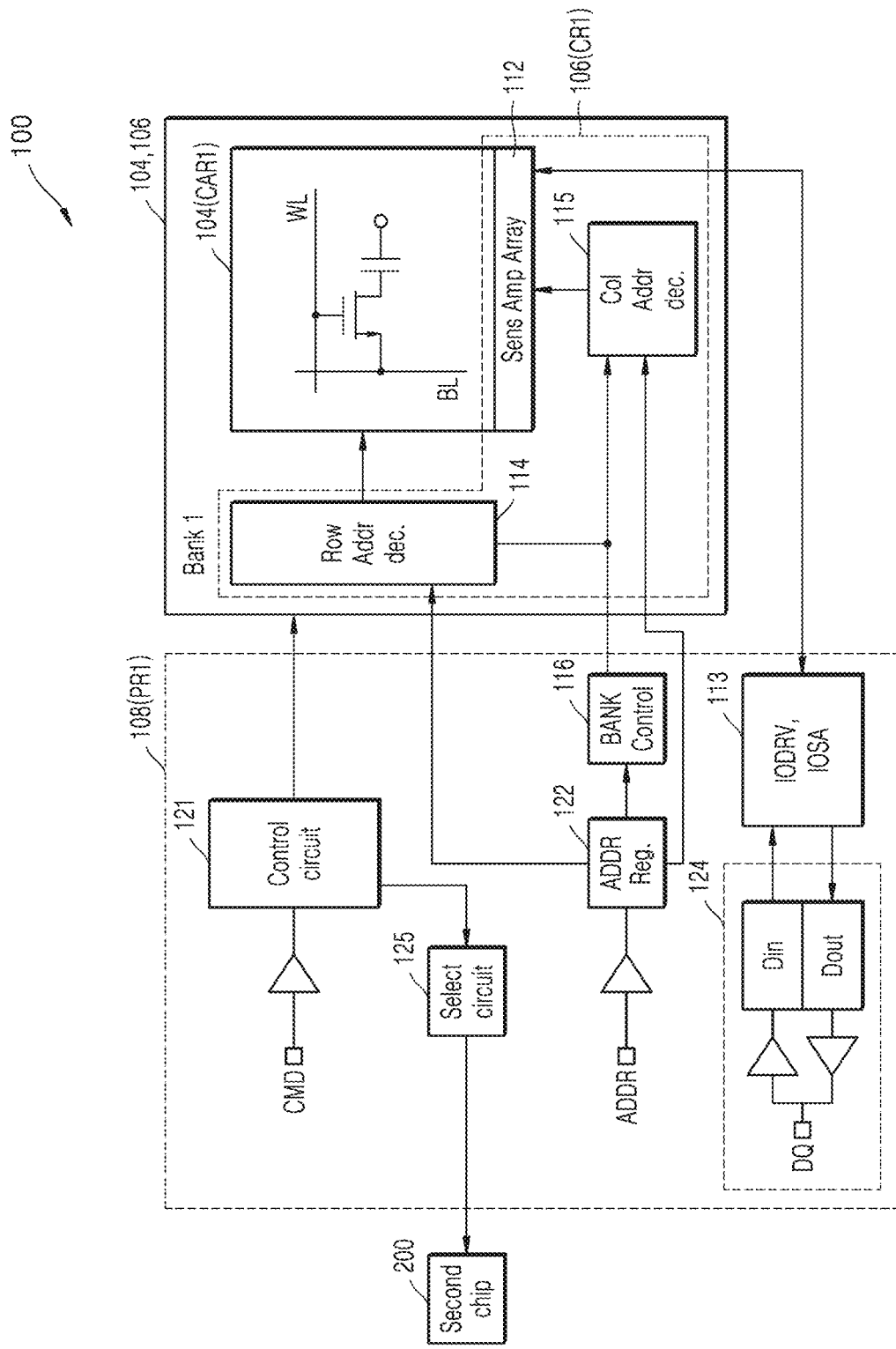
FIGS. 5 and 6 are block diagrams illustrating a configuration of the stacked-chip package of FIG. 1.
Figure 6:
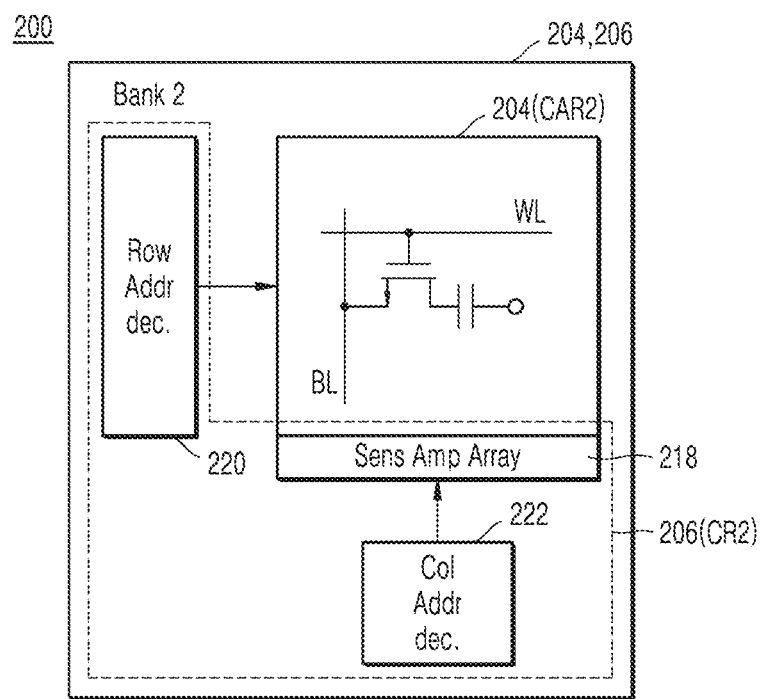

FIGS. 5 and 6 are block diagrams illustrating a configuration of the stacked-chip package of FIG. 1.

In detail, FIG. 5 may be an example of a configuration of the first chip 100 constituting the stacked-chip package 10 of FIG. 1, and FIG. 6 may be an example of a configuration of the second chip 200 constituting the stacked-chip package 10 of FIG. 1. In FIG. 5, only one of the first cell array regions 104a and 104b of the first chip 100 is denoted by reference numeral 104, and only one of the first core circuit regions 106a and 106b is denoted by the reference numeral 106.

In FIG. 6, only one of the second cell array regions 204a and 204b of the second chip 200 is denoted by reference numeral 204, and only one of the second core circuit regions 206a and 206b is denoted by reference numeral 206.

As shown in FIG. 5, the first chip 100 includes first cell regions 104 and 106 and a first peripheral circuit region 108. The first cell regions 104 and 106 shown in FIG. 5 represent any one cell region, that is, a bank (for example, a first bank, Bank 1) among a plurality of cell regions formed on the first chip 100.

The first cell regions 104 and 106 include a first cell array region 104 and a first core circuit region 106. The first cell array region 104 may include a first cell array circuit CAR1. The first cell array circuit CAR1 may include a word line WL, a bit line BL, a transistor, and/or a capacitor.

The first core circuit region 106 may include a first core circuit CR1. The first core circuit CR1 may include a first sense amplifier array 112, a first row address decoder 114, a first column address decoder 115, and the like. The first core circuit CR1 may sense data or transmit read and write signals of the first cell array circuit CAR1 using the first sense amplifier array 112, the first row address decoder 114, and the first column address decoder 115.

The first peripheral circuit region 108 may include a first peripheral circuit PR1. The first peripheral circuit PR1 may control the first cell array circuit CAR1 and the first core circuit CR1, and may receive and transmit data input/output signals.

In more detail, the first peripheral circuit PR1 may include a first control circuit 121 that receives an external command signal CMD and generates a control signal in response to the command signal CMD. The first peripheral circuit PR1 may include an address register 122 that receives an address signal ADDR and provides the address signal ADDR to the first row address decoder 114. The first peripheral circuit PR1 may include a bank controller 116 for controlling bank selection, etc., when a memory operation is controlled for each bank.

The first peripheral circuit PR1 may include a first input/output driver and a first input/output sense amplifier 113 that receive and transmit the data input/output signal DQ, and a first data input/output unit 124. Din may be a data input terminal, and Dout may be a data output terminal.

In addition, the first peripheral circuit PR1 may include a first selection circuit 125 connected to the first control circuit 121. The first selection circuit 125 may be a switch circuit or a fuse circuit. The stacked-chip package 10 may select and control the first chip 100 and/or the second chip 200 using the first control circuit 121 and the first selection circuit 125. Even when one of the first chip 100 and the second chip 200 does not operate, the stacked-chip package 10 is capable of operating the other chip, thereby greatly improving package reliability.

As shown in FIG. 6, the second chip 200 may include second cell regions 204 and 206 connected to the first peripheral circuit PR1. The second cell regions 204 and 206 shown in FIG. 6 represent one cell region, that is, a bank (for example, a second bank, Bank 2) among a plurality of cell regions formed on the second chip 200.

The second cell regions 204 and 206 include a second cell array region 204 and a second core circuit region 206. The second cell array region 204 may include a second cell array circuit CAR2. The second cell array circuit CAR2 may include a word line WL, a bit line BL, a transistor, and/or a capacitor.

The second core circuit region 206 may include a second core circuit CR2. The second core circuit CR2 may include a second sense amplifier array 218, a second row address decoder 220, a second column address decoder 222, and the like. The second core circuit CR2 may sense data or transmit read and write signals of the second cell array circuit CAR2 using the second sense amplifier array 218, the second row address decoder 220, and the second column address decoder 222.

Figure 7:
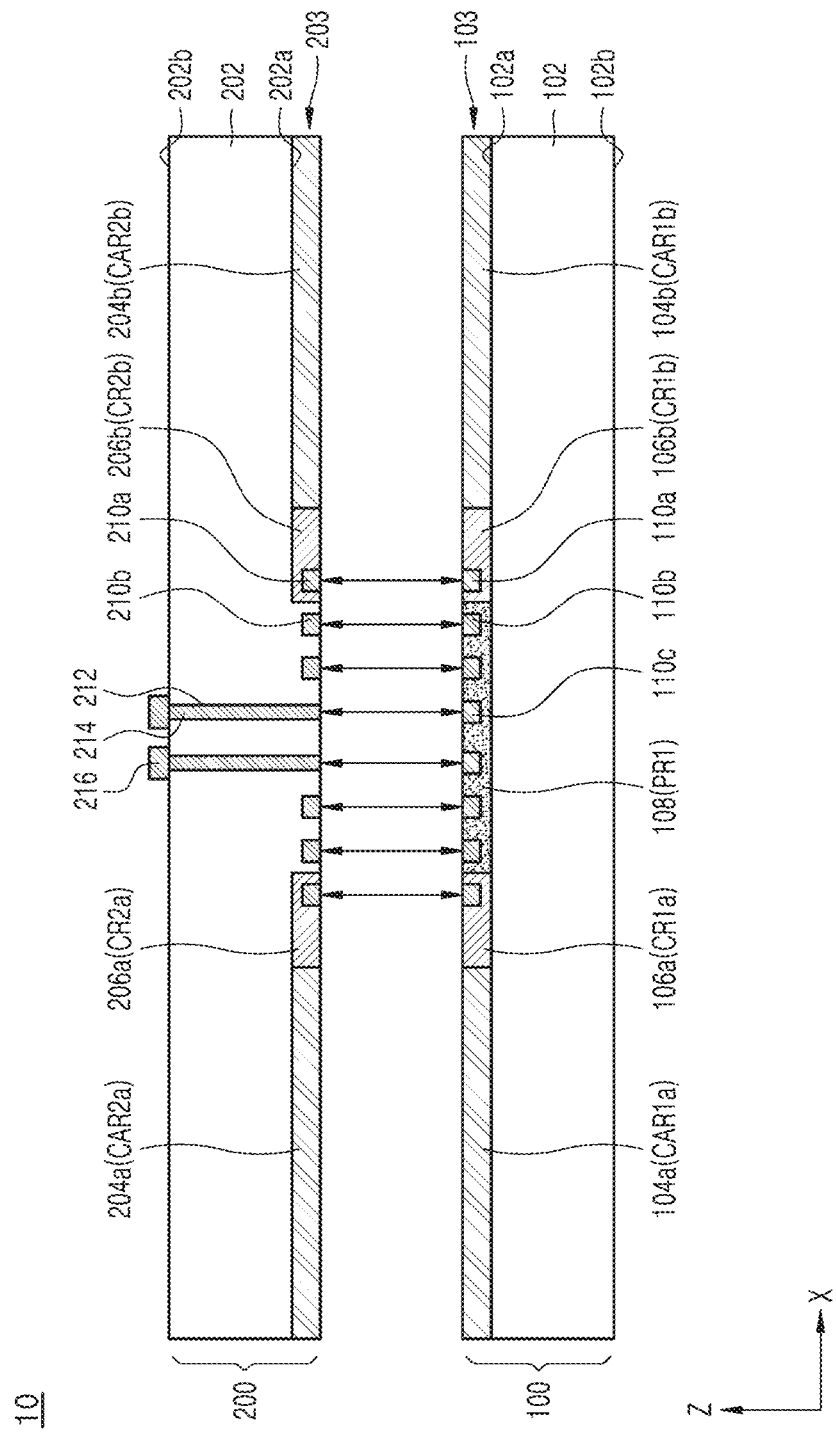
FIG. 7 is a cross-sectional view illustrating a bonding process of a first chip to a second chip constituting the stacked-chip package of FIG. 1.

FIG. 7 is a cross-sectional view illustrating a bonding process of a first chip to a second chip constituting the stacked-chip package of FIG. 1.

In detail, a stacked-chip package 10 may be manufactured by bonding the first chip 100 to the second chip 200. In FIG. 7, the same reference numerals as in FIG. 1 denote the same members. In FIG. 7, description previously given with respect to FIG. 1 is briefly given or omitted.

In order to manufacture the stacked-chip package 10, the first chip 100 is prepared. The first chip 100 forms first cell array regions 104a and 104b, first core circuit regions 106a and 106b, and a first peripheral circuit region 108 on a first surface 102a of a first substrate 102. A first circuit element layer 103 is formed on the first surface 102a of the first substrate 102, the first circuit element layer 103 including the first cell array regions 104a and 104b, first core circuit regions 106a and 106b, and a first peripheral circuit region 108.

First cell array circuit CAR1a is formed in the first cell array region 104a, and first cell array circuit CAR1b is formed in the first cell array region 104b. First core circuits CR1a and CR1b and first core terminals 110a are formed in the first core circuit regions 106a and 106b. A first peripheral circuit PR1 and first peripheral circuit terminals 110b and 110c are formed in the first peripheral circuit region 108. The first peripheral circuit terminal 110b may be classified as a first connection terminal 110b, and the first peripheral circuit terminal 110c may be classified as a through-via connection terminal 110c.

A second chip 200 is prepared to manufacture the stacked-chip package 10. The second chip 200 forms second cell array regions 204a and 204b, second core circuit regions 206a and 206b, a second connection terminal 210b, and a second through via 214 on a third surface 202a of the second substrate 202. A second circuit element layer 203, a second connection terminal 210b, and a second through via 214 are formed on the third surface 202a of the second substrate 202, the second circuit element layer 203 including second cell array regions 204a and 204b and second core circuit regions 206a and 206b.

Second cell array circuit CAR2a is formed in the second cell array region 204a, and second cell array circuit CAR2b is formed in the second cell array region 204b. Second core circuit CR2a and second core terminal 210a are formed in the second core circuit region 206a, and second core circuit CR2a and second core terminal 210a are formed in the second core circuit region 206b.

In order to manufacture the stacked-chip package 10, the second chip 200 is bonded on the first chip 100. A first circuit element layer 103 of the first chip 100 is directly bonded to the second circuit element layer 203 of the second chip 200. The first core terminal 110a, the first connection terminal 110b, and the through-via connection terminal 110c of the first chip 100 are directly bonded to the second core terminal 210a, the second connection terminal 210b, and the second through-via 214 of the second chip 200, respectively. As described above, the stacked-chip package 10 may be manufactured by directly bonding the terminals of the first chip 100, the terminals of the second chip 200, and the second through via 214.

Figure 8:
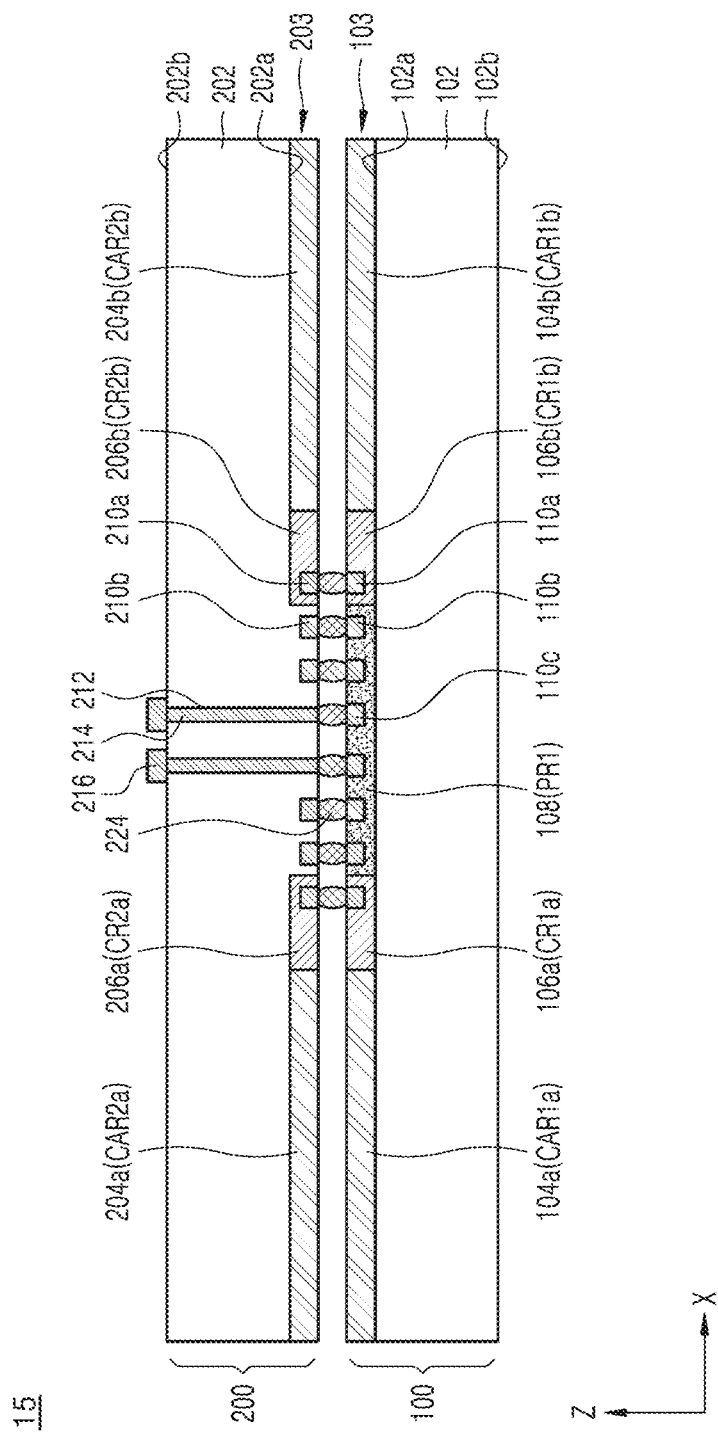
FIG. 8 is a cross-sectional view of a main part showing a stacked-chip package according to some example embodiments of the inventive concepts.

FIG. 8 is a cross-sectional view of a main part showing a stacked-chip package according to some example embodiments of the inventive concepts.

In detail, a stacked-chip package 15 may be the same as the stacked-chip package 10 of FIG. 1, except that a first core terminal 110a and first peripheral circuit terminals 110b and 110c of a first chip 100 are bonded through bumps 224 to a second core terminal 210a, a second connection terminal 210b, and a second through via 214 of a second chip 200, respectively. For example, and as shown in FIG. 8, a second core terminal 210a may be connected via a first bump 224 to a first core terminal 110a, a second through via 214 may be connected via a second bump 224 to a through via connection terminal 110c, and a second connection terminal 210b may be connected via a third bump 224 to a first connection terminal 110b. In FIG. 8, the same reference numerals as in FIG. 1 denote the same members. In FIG. 8, description previously given with respect to FIG. 1 is briefly given or omitted.

In the first chip 100, a first circuit element layer 103 is formed on a first surface 102a of a first substrate 102, the first circuit element layer 103 including the first cell array regions 104a and 104b, the first core circuit regions 106a and 106b, and the first peripheral circuit region 108. First core terminals 110a and first peripheral circuit terminals 110b and 110c are formed in the first core circuit regions 106a and 106b and the first peripheral circuit region 108, respectively. The first peripheral circuit terminal 110b may be classified as a first connection terminal 110b, and the first peripheral circuit terminal 110c may be classified as a through-via connection terminal 110c.

In the second chip 200, a second circuit element layer 203, a second connection terminal 210b, and a second through via 214 are formed on the third surface 202a of the second substrate 202, the second circuit element layer 203 including second cell array regions 204a and 204b and second core circuit regions 206a and 206b.

In the stacked-chip package 15, the first chip 100 is not directly bonded to the second chip 200. In the stacked-chip package 15, the first core terminals 110a and the first peripheral circuit terminals 110b and 110c of the first chip 100 are bonded through bumps 224 to the second core terminals 210a, the second connection terminals 210b, and the second through vias 214, respectively. In the stacked-chip package 15, the first chip 100 may be easily connected (or bonded) to the second chip 200 by using the bumps 224.

Figure 9:
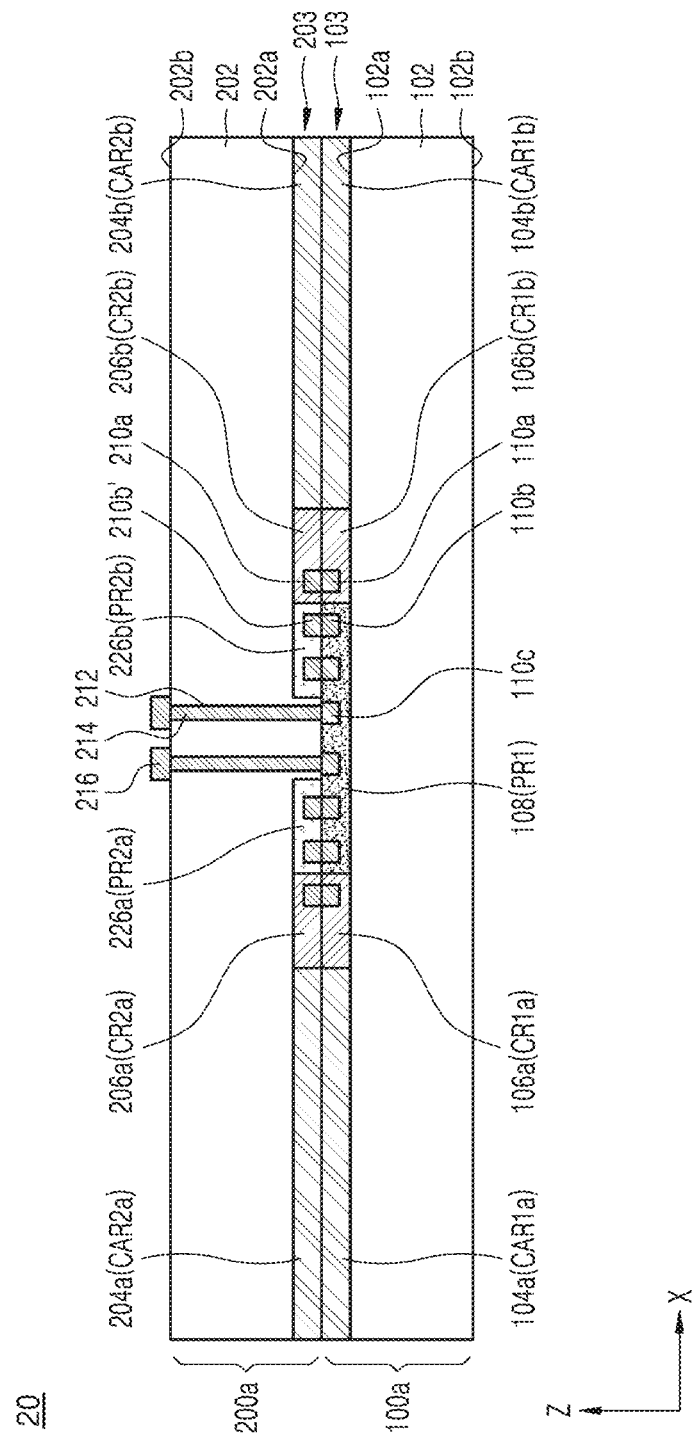
FIG. 9 is a cross-sectional view of a main part showing a stacked-chip package according to some example embodiments of the inventive concepts.

FIG. 9 is a cross-sectional view illustrating a stacked-chip package according to some example embodiments of the inventive concepts.

In detail, a stacked-chip package 20 may be the same as the stacked-chip package 10 of FIG. 1 except that second peripheral circuit regions 226a and 226b are further formed in a second connection terminal region (208b of FIG. 4) of a second chip 200a. In FIG. 9, the same reference numerals as in FIG. 1 denote the same members. In FIG. 9, description previously given with respect to FIG. 1 is briefly given or omitted.

The stacked-chip package 20 is configured by stacking the second chip 200a on a first chip 100a. The first chip 100a may be the same as the first chip 100 of the stacked-chip package 10 of FIG. 1. In the second chip 200a, second peripheral circuit regions 226a and 226b are formed on the first peripheral circuit region 108 of the first chip 100a and in a second connection terminal region (208b in FIG. 4) on both sides (e.g., opposite sides) of the second through via 214.

The second peripheral circuit regions 226a and 226b may be smaller in size than the first peripheral circuit region 108. The second chip 200a includes a second circuit element layer 203 having second cell array regions 204a and 204b, second core circuit regions 206a and 206b, and second peripheral circuit regions 226a and 226b.

The second peripheral circuit region 226a may connect the second core circuit region 206a to the first peripheral circuit region 108, and the second sub-peripheral circuit region 226b may connect the second core circuit region 206b to the first peripheral circuit region 108. The second peripheral circuit regions 226a and 226b may control the second cell array regions 204a and 204b and the second core circuit regions 206a and 206b, and may receive and transmit data input/output signals. The second peripheral circuit regions 226a and 226b may include second peripheral circuits PR2a and PR2b.

The second peripheral circuit regions 226a and 226b may be referred to as a first sub-peripheral circuit region 226a and a second sub-peripheral circuit region 226b. The first sub-peripheral circuit region 226a and the second sub-peripheral circuit region 226b may be apart from each other in a horizontal direction, that is, in an X direction. The horizontal direction may be a direction horizontal to a third surface 202a of a second substrate 202.

The second peripheral circuit regions 226a and 226b may include second connection terminals 210b'. The second peripheral circuit terminals 210b' may be bonded to the first peripheral circuit terminals 110b of the first chip 100a, that is, first connection terminals. The second peripheral circuit terminals 210b' may correspond to second connection terminals (210b of FIG. 1) that are bonded (or connected) to the first connection terminals 110b of the first chip 100a. The stacked-chip package 20 may implement circuits having various functions, including the second peripheral circuit regions 226a and 226b in the second chip 200a.

Figure 10:
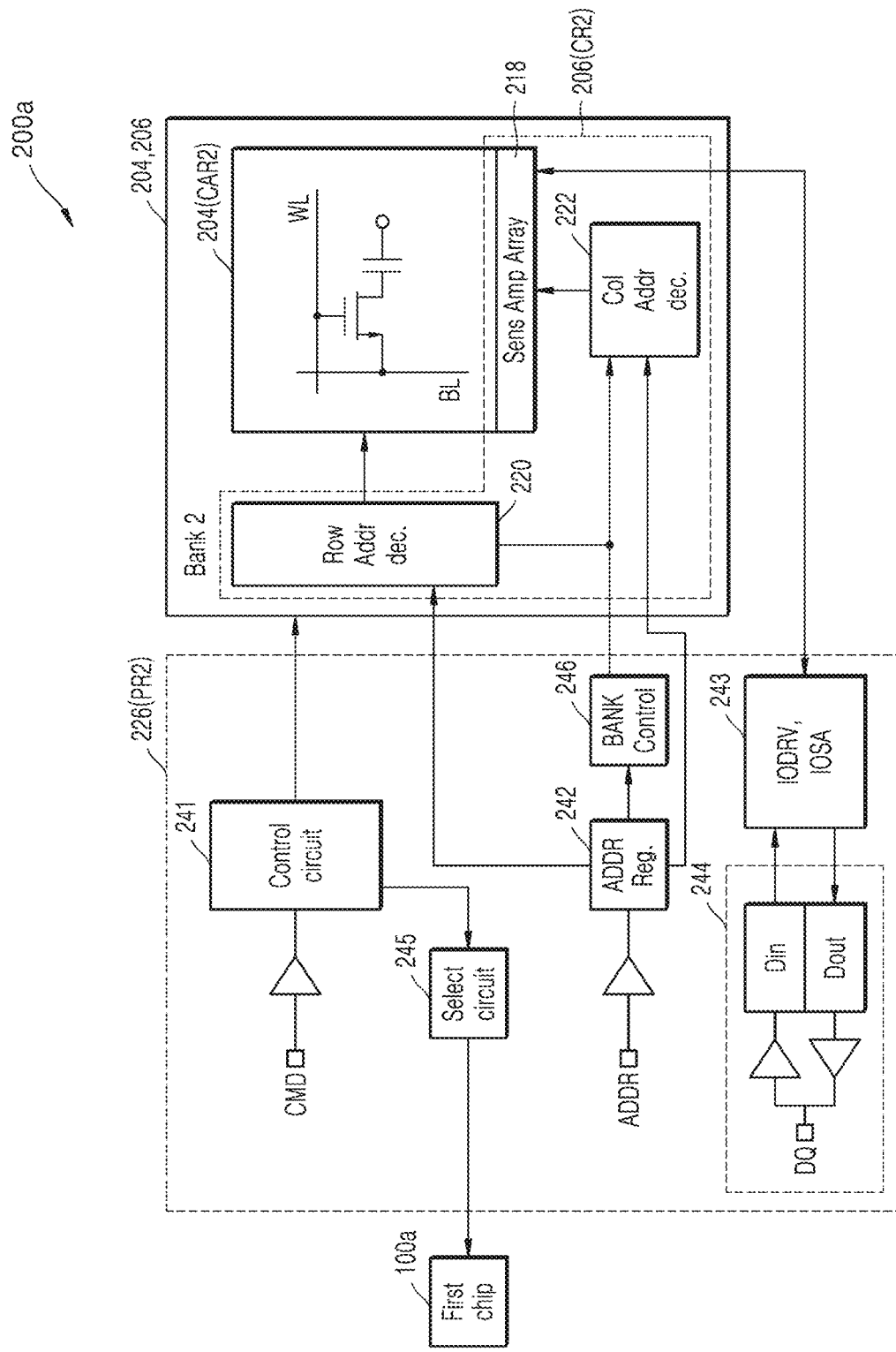
FIG. 10 is a block diagram illustrating a configuration of a second chip of the stacked-chip package of FIG. 9.

FIG. 10 is a block diagram illustrating a configuration of a second chip of the stacked-chip package of FIG. 9.

In detail, FIG. 10 may be a configuration example of a second chip 200a constituting the stacked-chip package 20 of FIG. 9. In FIG. 10, the same reference numerals as in FIGS. 5 and 6 denote the same members. In FIG. 10, only one of second cell array regions 204a and 204b of the second chip 200a is denoted by reference numeral 204, and only one of second core circuit regions 206a and 206b is denoted by reference numeral 206.

As shown in FIG. 10, second cell regions 204 and 206 represent any one cell region, that is, a bank (for example, a second bank, Bank 2) among a plurality of cell regions formed on the second chip 200a. The second cell regions 204 and 206 of the second chip 200a include a second cell array region 204 and a second core circuit region 206.

The second cell array region 204 may include a second cell array circuit CAR2. The second core circuit region 206 may include a second core circuit CR2. The second cell array circuit CAR2 and the second core circuit CR2 have been described with respect to FIG. 6 and thus descriptions thereof are omitted.

The second peripheral circuit region 226 of the second chip 200a may have substantially the same function as the first peripheral circuit region 108 of FIG. 5. The second peripheral circuit region 226 may include a second peripheral circuit PR2. The second peripheral circuit PR2 may control the second cell array circuit CAR2 and the second core circuit CR2, and may receive and transmit data input/output signals.

In more detail, the second peripheral circuit PR2 may include a second control circuit 241 that receives an external command signal CMD and generates a control signal in response to the external command signal CMD. The second peripheral circuit PR2 may include an address register 242 that receives an address signal ADDR and provides the address signal ADDR to a second row address decoder 220. The second peripheral circuit PR2 may include a bank controller 246 for controlling bank selection, etc. when a memory operation is controlled for each bank.

The second peripheral circuit PR2 may include a second input/output driver and input/output sense amplifier 243 that receives and transmits the data input/output signal DQ, and a second data input/output unit 244. Din may be a data input terminal, and Dout may be a data output terminal.

In addition, the second peripheral circuit PR2 may include a second selection circuit 245 connected to the second control circuit 241. The second selection circuit 245 may be a switch circuit or a fuse circuit. The stacked-chip package 20 may select and control the first chip 100a and/or the second chip 200a using the second control circuit 241 and the second selection circuit 245.

The stacked-chip package 20 may operate the other chip even when one of the first chip 100a and the second chip 200a does not operate, thereby greatly improving package reliability. The second chip 200a may be connected to the first chip 100a through the second peripheral circuit PR2. The structure of the first chip 100 has been described above and thus descriptions thereof are omitted.

Figure 11:
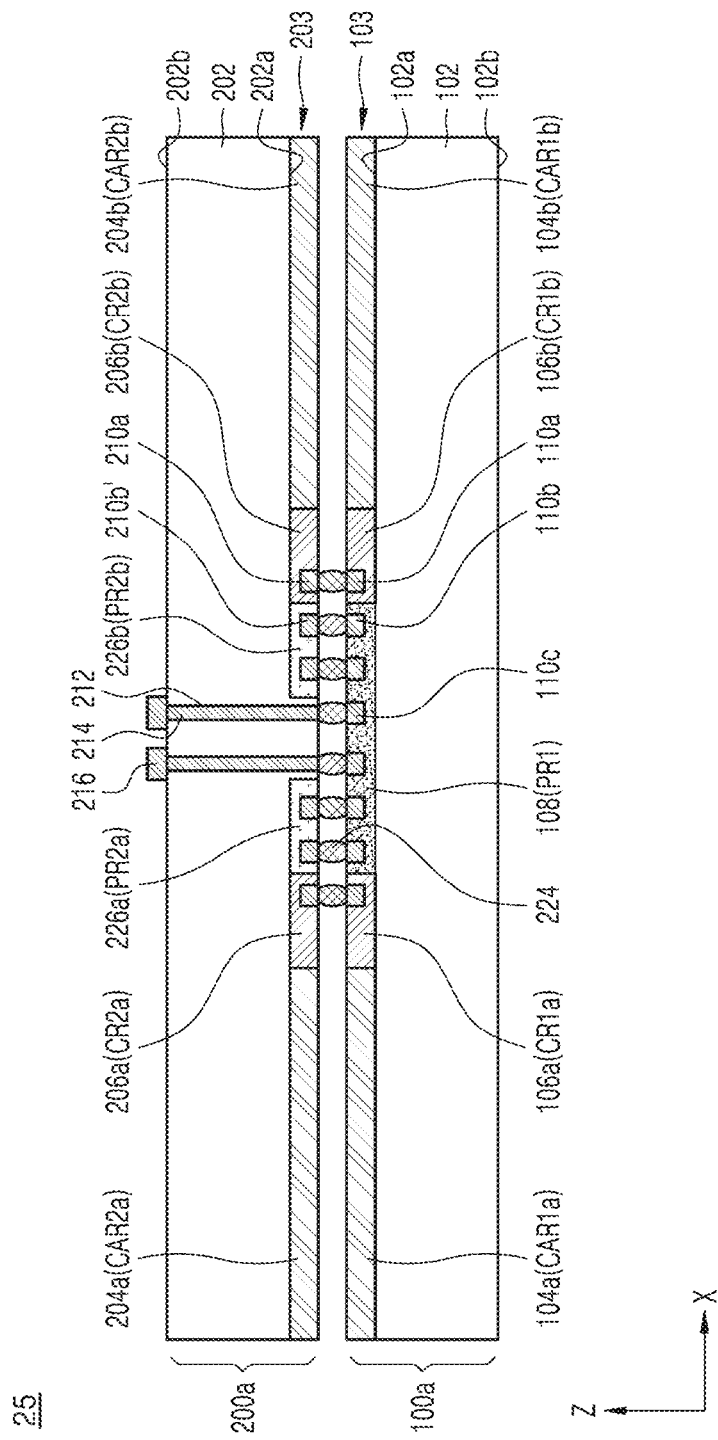
FIG. 11 is a cross-sectional view of a main part showing of a stacked-chip package according to some example embodiments of the inventive concepts.

FIG. 11 is a cross-sectional view illustrating a main part of a stacked-chip package according to some example embodiments of the inventive concepts.

In detail, a stacked-chip package 25 may be the same as the stacked-chip package 20 of FIG. 9, except that a first core terminal 110a and first peripheral circuit terminals 110b and 110c of a first chip 100a are bonded through bumps 224 to a second core terminal 210a, a second connection terminal 210b', and a second through via 214 of a second chip 200a. In FIG. 11, the same reference numerals as in FIG. 9 denote the same members. In FIG. 11, description previously given with respect to FIG. 9 are briefly described or omitted.

The stacked-chip package 25 is configured by stacking the second chip 200a on the first chip 100a. The first chip 100a may be the same as the first chip 100a of the stacked-chip package 20 of FIG. 9. In the first chip 100a, the first core terminal 110a and first peripheral circuit terminals 110b and 110c are formed on a first circuit element layer 103. The first peripheral circuit terminal 110b may be classified as a first connection terminal 110b, and the first peripheral circuit terminal 110c may be classified as a through-via connection terminal 110c.

A second core terminal 210a, a second connection terminal 210b', and a second through via 214 are formed in the second circuit element layer 203 of the second chip 200a. In the stacked-chip package 25, the first chip 100a is not directly bonded to the second chip 200a. In the stacked-chip package 25, the first core terminals 110a and the first peripheral circuit terminals 110b and 110c of the first chip 100a are bonded through bumps 224 to the second core terminals 210a, the second connection terminals 210b', and the second through vias 214, respectively. In the stacked-chip package 25, the first chip 100a may be easily connected (or bonded) to the second chip 200a by using the bumps 224.

Figure 12:
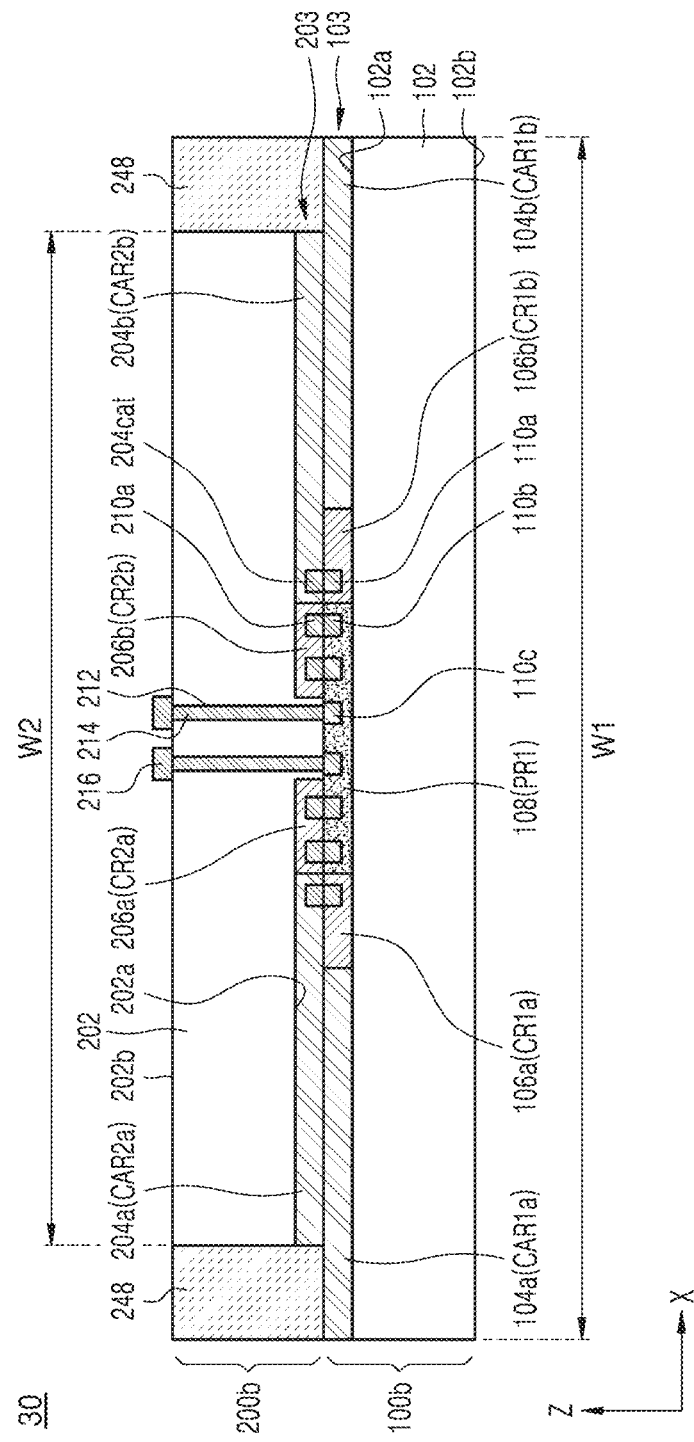
FIG. 12 is a cross-sectional view of a main part showing a stacked-chip package according to some example embodiments of the inventive concepts.

FIG. 12 is a partial cross-sectional view illustrating a stacked-chip package according to some example embodiments of the inventive concepts.

In detail, a stacked-chip package 30 may be the same as the stacked-chip package 10 of FIG. 1 except that a first width W1 of a first chip 100b is different from a second width W2 of a second chip 200b stacked on a first chip 100b. In FIG. 12, the same reference numerals as in FIG. 1 denote the same members. In FIG. 12, description previously given with respect to FIG. 1 is briefly given or omitted.

The stacked-chip package 30 is configured by stacking a second chip 200b on a first chip 100b. The first chip 100b may be the same as the first chip 100 of the stacked-chip package 10 of FIG. 1. The first chip 100b includes a first circuit element layer 103 which includes first cell array regions 104a and 104b, first core circuit regions 106a and 106b, and a first peripheral circuit region 108. The second chip 200b includes a second circuit element layer 203 which includes second cell array regions 204a and 204b and second core circuit regions 206a and 206b.

In the stacked-chip package 30, a second width W2 of the second chip 200b may be smaller than (e.g., less than) a first width W1 of the first chip 100b in a horizontal direction, e.g., an X direction. Accordingly, the second cell array regions 204a and 204b of the second chip 200b may be positioned on the first core circuit regions 106a and 106b of the first chip 100b. The second core circuit regions 206a and 206b of the second chip 200b may be positioned on the first peripheral circuit region 108 of the first chip 100b. As shown in FIG. 12, at least one peripheral circuit terminal (e.g., a first connection terminal 110b, which may be separate from the through via connection terminal 110c connected to the second through via(s) 214) of the first peripheral circuit terminals 110b and 110c may be bonded to one or more second core terminals 210a. As shown in FIG. 12, the second cell array regions 204a and 204b of the second chip 200b may include terminals 204cat that may be connected (e.g., bonded) to the first core terminals 110a.

In the stacked-chip package 30, mold layers 248 are formed on the first circuit element layer 103 of the first chip 100b and on both sides (e.g., opposite sides) of the second chip 200b. A mold layer 248 is formed in a stepped region between the first chip 100b and the second chip 200b in a vertical direction, that is, in a Z direction. The stacked-chip package 30 may easily connect (or bond) the first chip 100b to the second chip 200b, even if the widths of the first chip 100b and the second chip 200b are different.

Figure 13:
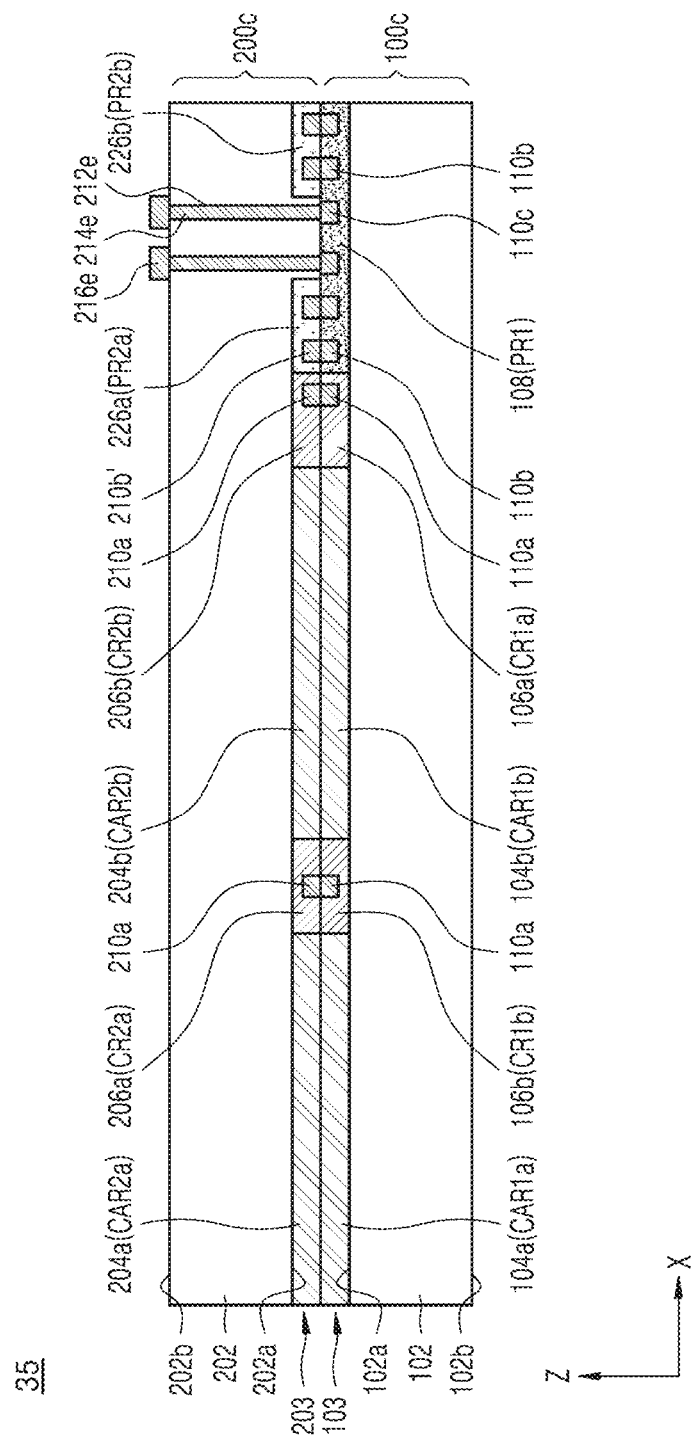
FIG. 13 is a cross-sectional view of a main part showing a stacked-chip package according to some example embodiments of the inventive concepts.

FIG. 13 is a cross-sectional view of a main part showing a stacked-chip package according to some example embodiments of the inventive concepts.

In detail, a stacked-chip package 35 may be the same as the stacked-chip package 20 of FIG. 9 except that, as shown, a second through via 214e and a second pad 216e for external connection are included in the edge portion of the second substrate 202, such that the second through via 214e is located at an edge portion of the second chip 200c. In FIG. 13, the same reference numerals as in FIG. 9 denote the same members. In FIG. 13, description previously given with respect to FIG. 9 is briefly given or omitted.

The stacked-chip package 35 is configured by stacking a second chip 200c on a first chip 100c. The first chip 100c may be substantially the same as the first chip 100a of the stacked-chip package 20 of FIG. 9. The first chip 100c includes a first circuit element layer 103 which includes first cell array regions 104a and 104b, first core circuit regions 106a and 106b, and a first peripheral circuit region 108. As shown in at least FIG. 13, the first peripheral circuit region 108 may be located in an edge portion of the first substrate 102 and thus may be located at an edge portion of the first chip 100c.

The second chip 200c includes a second circuit element layer 203 which includes second cell array regions 204a and 204b, second core circuit regions 206a and 206b, and second peripheral circuit regions 226a and 226b. In the second chip 200c, a second through via 214e may be connected to the through via connection terminal 110c of the first peripheral circuit region 108 at an edge portion of the second substrate 202.

The second through via 214e may be referred to as a second edge through via. The second through via 214e may be formed in the second through hole 212e penetrating a second substrate 202 at the edge portion of the second substrate 202. A second pad 216e for external connection may be formed on a fourth surface 202b of the second substrate 202 on the second through via 214e. The second pad 216e for external connection may be referred to as a second edge pad for external connection (e.g., configured to establish an external connection to a device external to the stacked-chip package 35) and thus may be understood to be an edge pad that is on the second through via 214e that is at the edge portion of the second chip 200c, as shown in at least FIG. 13. The stacked-chip package 35 may easily connect the first chip 100c to the second chip 200c at the edge portions of the first chip 100c and the second chip 200c.

Figure 14:
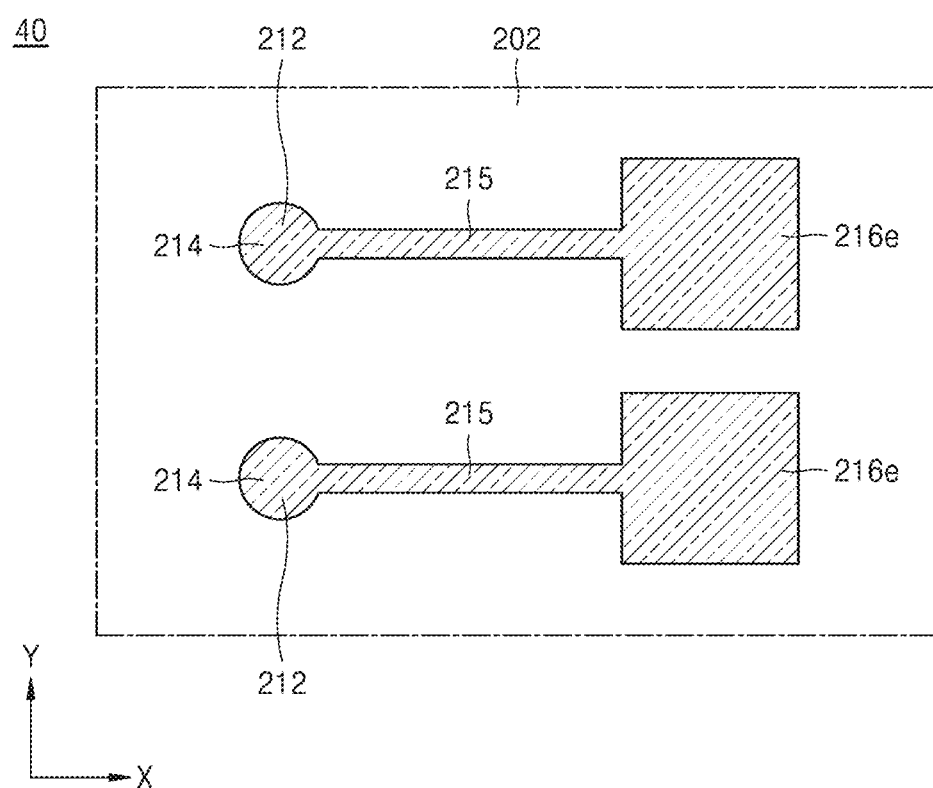
FIG. 14 is a plan view illustrating a main part of a stacked-chip package according to some example embodiments of the inventive concepts.

FIG. 14 is a plan view illustrating a main part of a stacked-chip package according to some example embodiments of the inventive concepts.

In detail, a stacked-chip package 40 may be the same as the stacked-chip package 10 of FIG. 13 except that a second through via 214 is formed in a central portion of a second substrate 202 and a second pad 216e for external connection is formed in an edge portion of the second substrate 202.

In the stacked-chip package 40 of FIG. 14, a second through hole 212 may be formed in the central portion of the second substrate 202. A second through via 214 may be formed in the second through hole 212. The second through via 214 may be connected to a rewiring layer 215. The rewiring layer 215 may be connected to the second through via 214e.

The second through via 214e may be referred to as a second edge through via. The rewiring layer 215 may be connected to a second pad 216e for external connection. The second pad 216e for external connection may be referred to as a second edge pad for external connection. The stacked-chip package 40 may easily connect the first chip (100c of FIG. 13) to the second chip (200c of FIG. 13) in the edge portions of the first chip 100c and the second chip 200c.

Figure 15:
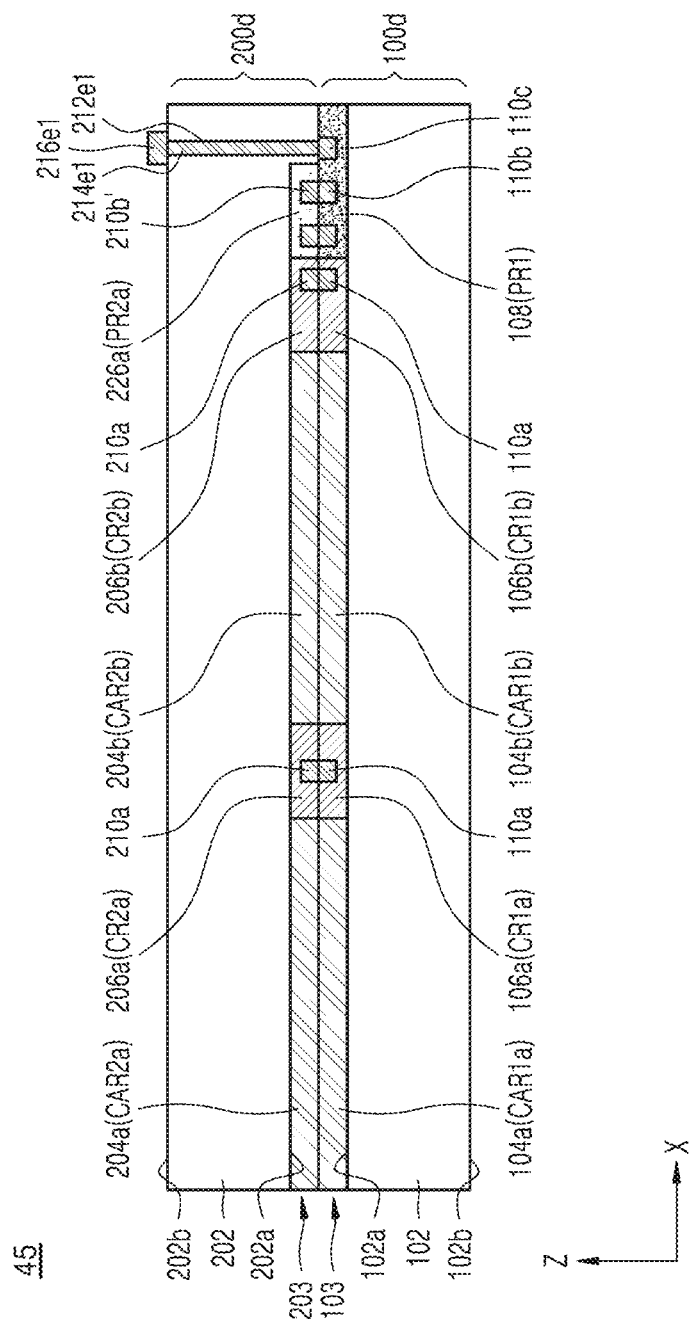
FIG. 15 is a cross-sectional view of a main part showing a stacked-chip package according to some example embodiments of the inventive concepts.

FIG. 15 is a cross-sectional view of a main part showing a stacked-chip package according to some example embodiments of the inventive concepts.

In detail, a stacked-chip package 45 may be the same as the stacked-chip package 35 of FIG. 13 except that one second through via 214e1, one second pad 216e1 for external connection, and one second peripheral circuit region 226a are included in the right edge portion of the second substrate 202 In FIG. 15, the same reference numerals as in FIG. 13 denote the same members. In FIG. 15, description previously given with respect to FIG. 13 are briefly described or omitted.

The stacked-chip package 45 is configured by stacking a second chip 200d on a first chip 100d. The first chip 100d may be substantially the same as the first chip 100a of the stacked-chip package 20 of FIG. 9. The first chip 100d includes a first circuit element layer 103 which includes first cell array regions 104a and 104b, first core circuit regions 106a and 106b, and a first peripheral circuit region 108. The first peripheral circuit region 108 may be located at an edge portion of the first substrate 102.

The second chip 200d includes a second circuit element layer 203 which includes second cell array regions 204a and 204b, second core circuit regions 206a and 206b, and a second peripheral circuit region 226a. In the second chip 200d, the second through via 214e1 may be connected to the through via connection terminal 110c of the first peripheral circuit region 108 at an edge portion of the second substrate 202.

The second through via 214e1 may be referred to as a second edge through via. The second through via 214e1 may be formed in the second through hole 212e1 penetrating a second substrate 202 at a right edge portion of the second substrate 202. A second pad 216e1 for external connection may be formed on a fourth surface 202b of the second substrate 202 on the second through via 214e1. The second pad 216e1 for external connection may be referred to as a second edge pad for external connection. The stacked-chip package 45 may easily connect the first chip 100d to the second chip 200d at the right edge portions of the first chip 100d and the second chip 200d.

Figure 16:
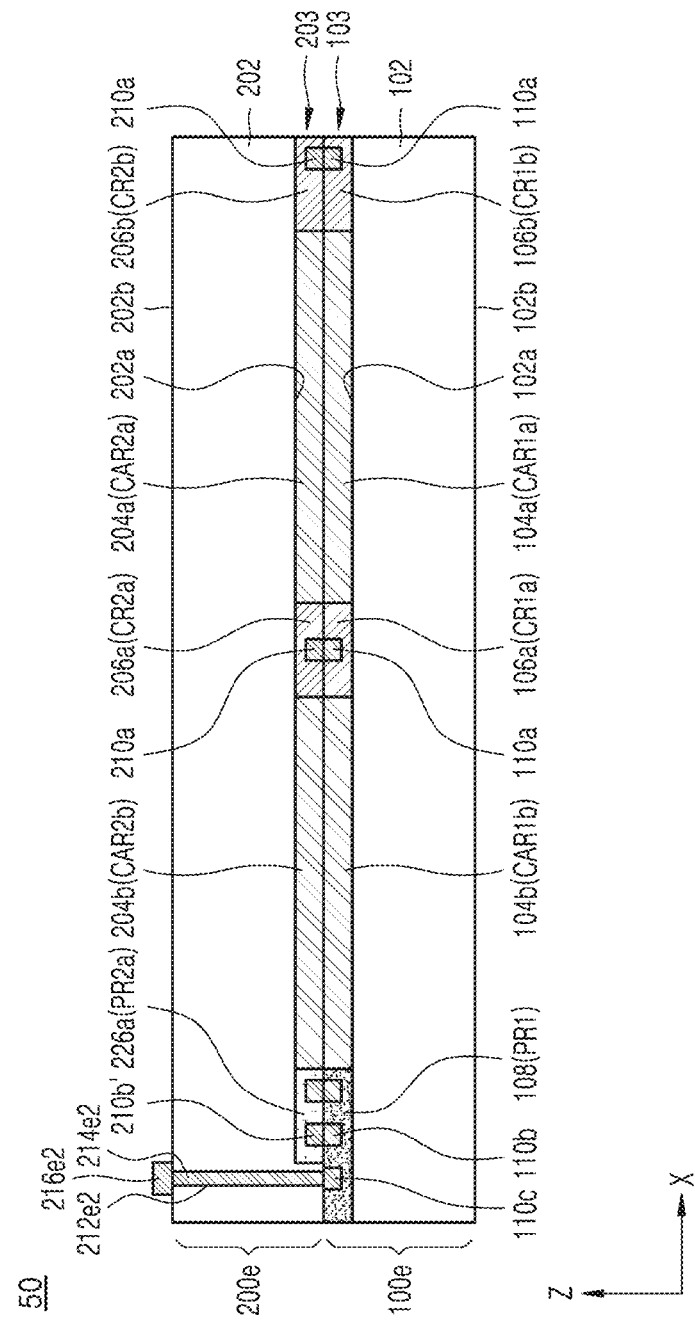
FIG. 16 is a cross-sectional view of a main part showing a stacked-chip package according to some example embodiments of the inventive concepts.

FIG. 16 is a cross-sectional view of a main part showing a stacked-chip package according to some example embodiments of the inventive concepts.

In detail, a stacked-chip package 50 may be the same as the stacked-chip package 35 of FIG. 13 except that one second through via 214e2, one second pad 216e2 for external connection, and one second peripheral circuit region 226a are included at the left edge portion of the second substrate 202. In FIG. 16, the same reference numerals as in FIG. 13 denote the same members. In FIG. 16, description previously given with respect to FIG. 13 are briefly described or omitted.

The stacked-chip package 50 is configured by stacking a second chip 200e on a first chip 100e. The first chip 100e may be substantially the same as the first chip 100a of the stacked-chip package 20 of FIG. 9. The first chip 100e includes a first circuit element layer 103 which includes a first cell array regions 104a and 104b, first core circuit regions 106a and 106b, and a first peripheral circuit region 108. The first peripheral circuit region 108 may be located at an edge portion of the first substrate 102.

The second chip 200e includes a second circuit element layer 203 which includes second cell array regions 204a and 204b, second core circuit regions 206a and 206b, and a second peripheral circuit region 226a. In the second chip 200e, a second through via 214e2 may be connected to the through via connection terminal 110c of the first peripheral circuit region 108 at a left edge of the second substrate 202.

The second through via 214e2 may be referred to as a second edge through via. The second through via 214e2 may be formed in the second through hole 212e2 penetrating a second substrate 202 at an edge portion of the second substrate 202. A second pad 216e2 for external connection may be formed on a fourth surface 202b of the second substrate 202 on the second through via 214e2. The second pad 216e2 for external connection may be referred to as a second edge pad for external connection. The stacked-chip package 50 may easily connect the first chip 100e to the second chip 200e at the left edge portions of the first chip 100e and the second chip 200e.

Figure 17:
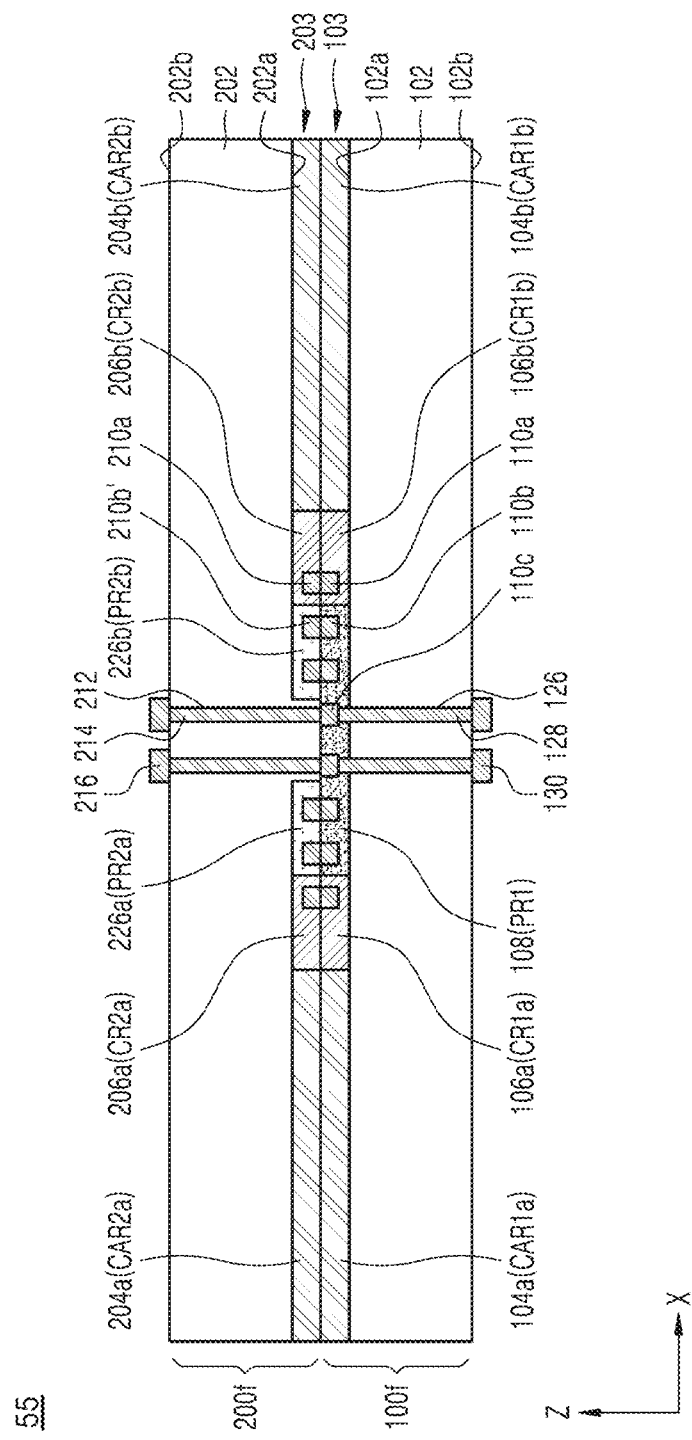
FIG. 17 is a cross-sectional view of a main part showing a stacked-chip package according to some example embodiments of the inventive concepts.

FIG. 17 is a cross-sectional view illustrating a main part of a stacked-chip package according to some example embodiments of the inventive concepts.

In detail, a stacked-chip package 55 may be the same as the stacked-chip package 20 of FIG. 9 except that a first through via 128 and a first pad 130 for external connection (e.g., configured to establish a first external connection, which may be a first electrical connection with a device external to the stacked-chip package 55) are included in a first substrate 102, and thus are included in the first chip 100f. In FIG. 17, the same reference numerals as in FIG. 9 denote the same members. In FIG. 17, description previously given with respect to FIG. 9 is briefly given or omitted.

The stacked-chip package 55 is configured by stacking a second chip 200f on a first chip 100f. The first chip 100f may be substantially the same as the first chip 100a of the stacked-chip package 20 of FIG. 9. The first chip 100f includes a first circuit element layer 103 which includes first cell array regions 104a and 104b, first core circuit regions 106a and 106b, and a first peripheral circuit region 108.

The first peripheral circuit region 108 may be located in a central portion of the first substrate 102. The first peripheral circuit region 108 may include first peripheral circuit terminals 110b and 110c. The first peripheral circuit terminals 110b and 110c may include a first connection terminal 110b and a through via connection terminal 110c.

A first through via 128 connected to the through via connection terminal 110c may be formed under the first peripheral circuit region 108 of the first chip 100f. The first through via 128 may be formed in a first through hole 126 penetrating the first substrate 102 and thus the first through via 128 may be understood to penetrate the first substrate 102. The first through via 128 may be referred to as a first conductive via. When the first substrate 102 is a silicon substrate, the first through via 128 may be a through silicon via (TSV).

In FIG. 17, the first through via 128 is shown to penetrate the first peripheral circuit region 108, but may not penetrate the first peripheral circuit region 108 in some example embodiments. For example, when the first peripheral circuit region 108 is not formed around and under the through via connection terminal 110c, the first through via 128 may not penetrate the first peripheral circuit region 108.

A first pad 130 for external connection, connected to the first through via 128, may be formed on a second surface 102b of the first substrate 102. The first pad 130 for external connection may not be formed in some example embodiments. The first pad 130 for external connection may be referred to as a first center pad for external connection.

The second chip 200f may be the same as the second chip 200a of the stacked-chip package 20 of FIG. 9. The second chip 200f includes a second circuit element layer 203 which includes second cell array regions 204a and 204b, second core circuit regions 206a and 206b, and second peripheral circuit regions 226a and 226b.

In the second chip 200f, a second through via 214 connected to the through via connection terminal 110c and a second pad 216 for external connection (e.g., configured to establish a second external connection, which may be a second electrical connection with a device external to the stacked-chip package 55) may be in a central portion of a second substrate 202. The second pad 216 for external connection may not be formed in some example embodiments. In the stacked-chip package 55, additional chips may be stacked using the first pad 130 for external connection or the second pad 216 for external connection.

In some example embodiments, the stacked-chip package 55 may include at least one of the first pad 130 or the second pad 216.

Figure 18:
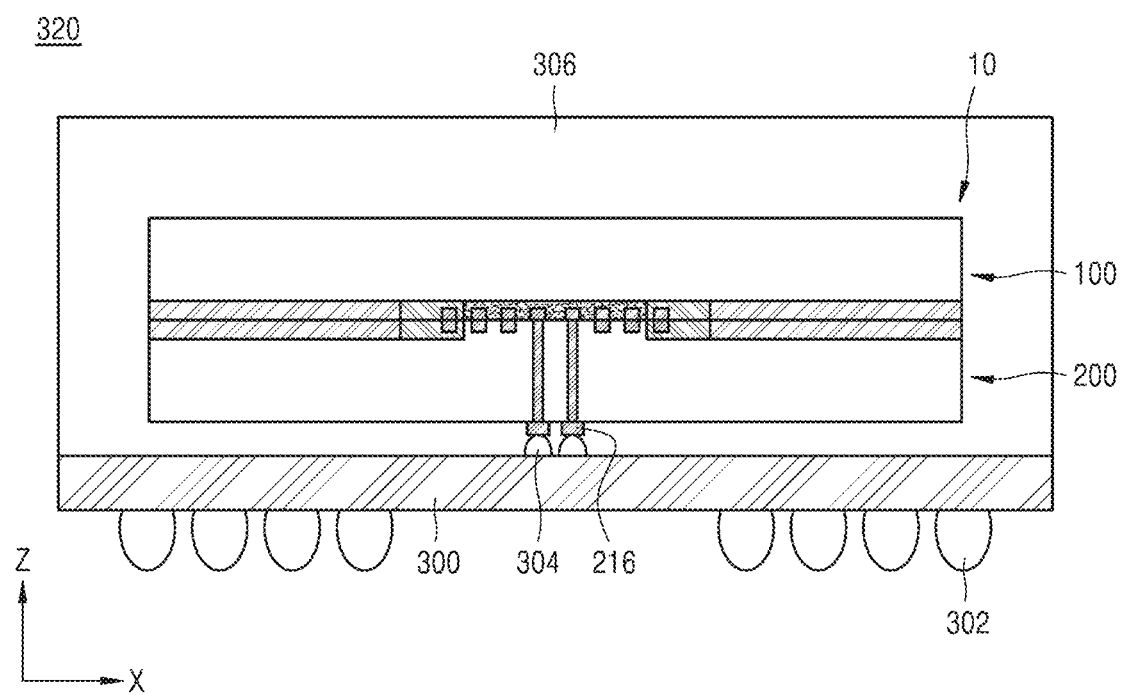
FIG. 18 is a cross-sectional view of a main part showing a stacked-chip package module according to some example embodiments of the inventive concepts.

FIG. 18 is a cross-sectional view of a main part of a stacked-chip package module using a stacked-chip package according to some example embodiments of the inventive concepts.

In detail, a stacked-chip package module 320 shows a state in which the stacked-chip package 10 of FIG. 1 is mounted on a package substrate 300. The stacked-chip package module 320 may be a stacked-chip package system. The package substrate 300 may be a printed circuit board (PCB) substrate. An external connection terminal 302 may be positioned on a lower surface of the package substrate 300. An internal connection terminal 304 may be positioned on an upper surface of the package substrate 300.

The stacked-chip package 10 of FIG. 1 is turned upside down and mounted on the upper surface of the package substrate 300. When the stacked-chip package 10 is mounted on the package substrate 300, a second pad 216 for external connection of a second chip 200 constituting the stacked-chip package 10 is connected to an internal connection terminal 304. The stacked-chip package 10 mounted on the package substrate 300 may be molded by a mold layer 306 to configure the stacked-chip package module 320.

In the stacked-chip package module 320 of FIG. 18, only the stacked-chip package 10 is mounted on the package substrate 300, but a passive element or the like may be mounted on the package substrate 300 if necessary.

Figure 19:
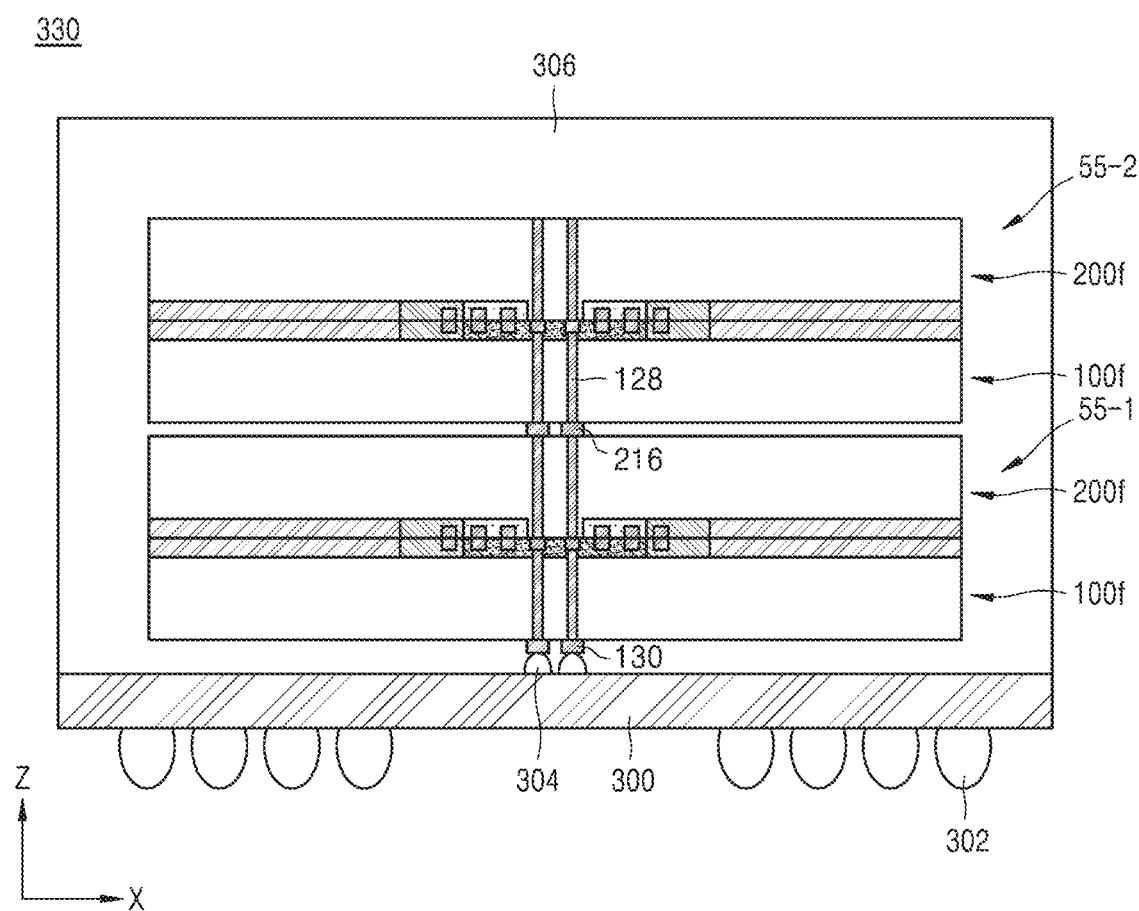
FIG. 19 is a cross-sectional view of a main part showing a stacked-chip package module using the stacked-chip package according to some example embodiments of the inventive concepts.

FIG. 19 is a cross-sectional view of main part of a stacked-chip package module using a stacked-chip package according to some example embodiments of the inventive concepts.

In detail, a stacked-chip package module 330 shows a state in which the stacked-chip package 55 shown in FIG. 17 is mounted on a package substrate 300. In FIG. 19, for convenience, two stacked-chip packages 55 are mounted on the package substrate 300. The stacked-chip package 55 is referred to as a first stacked-chip package 55-1 and a second stacked-chip package 55-2. The stacked-chip package module 330 may be a stacked-chip package system. The package substrate 300 may be a printed circuit board (PCB) substrate. An external connection terminal 302 may be positioned on a lower surface of the package substrate 300. An internal connection terminal 304 may be positioned on an upper surface of the package substrate 300.

The first stacked-chip package 55-1 is mounted on the upper surface of the package substrate 300. When the first stacked-chip package 55-1 is mounted on the package substrate 300, a first pad 130 for external connection of a first chip 100f constituting the first stacked-chip package 55-1 is connected to the internal connection terminal 304.

The second stacked-chip package 55-2 is mounted on the first stacked-chip package 55-1. When the second stacked-chip package 55-2 is mounted on the first stacked-chip package 55-1, a first through via 128 of the first chip 100f constituting the second stacked-chip package 55-2 may be connected to a second pad 216 for external connection of the second chip 200f.

The first stacked-chip package 55-1 and the second stacked-chip package 55-2 mounted on the package substrate 300 may be molded by a mold layer 306 to configure the stacked-chip package module 330. The stacked-chip package module 330 of FIG. 19 may turn upside down the first stacked-chip package 55-1 and the second stacked-chip package 55-2 to mount on the package substrate 300, if necessary.

In the stacked-chip package module 330 of FIG. 19, only the first stacked-chip package 55-1 and the second stacked-chip package 55-2 are mounted on the package substrate 300, but a passive element or the like may be mounted on the package substrate 300 if necessary.

Figure 20:
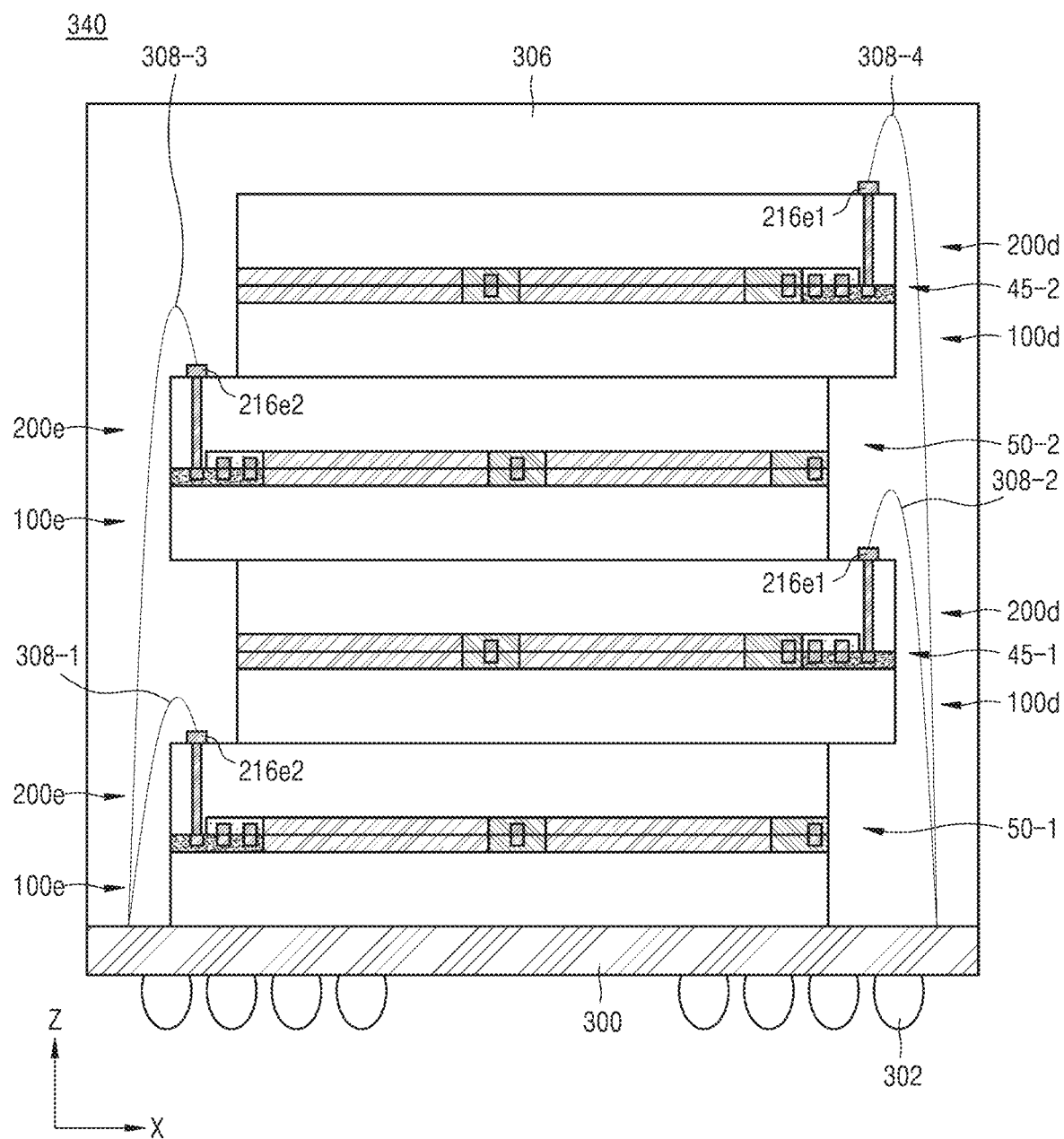
FIG. 20 is a cross-sectional view of a main part showing a stacked-chip package module using the stacked-chip package according to some example embodiments of the inventive concepts.

FIG. 20 is a cross-sectional view of main part of a stacked-chip package module using the stacked-chip package according to some example embodiments of the inventive concepts.

In detail, a stacked-chip package module 340 shows a state in which the stacked-chip packages 45 and 50 shown in FIGS. 15 and 16 are mounted on the package substrate 300. In FIG. 20, for convenience, two stacked-chip packages 45 and 50 are mounted on the package substrate 300, respectively.

The stacked-chip package 50 is referred to as a first stacked-chip package 50-1 and a third stacked-chip package 50-2. The stacked-chip package 45 is referred to as a second stacked-chip package 45-1 and a fourth stacked-chip package 45-2. The stacked-chip package module 340 may be a stacked-chip package system. The package substrate 300 may be a printed circuit board (PCB) substrate. An external connection terminal 302 may be positioned on a lower surface of the package substrate 300. An internal connection terminal 304 may be positioned on the upper surface of the package substrate 300.

The first stacked-chip package 50-1 is mounted on the upper surface of the package substrate 300. The first stacked-chip package 50-1 may include a first chip 100e and a second chip 200e. Second pads 216e2 for first external connection of the first stacked-chip package 50-1 are connected to the package substrate 300 using a first bonding wire 308-1.

The second stacked-chip package 45-1 is mounted on the first stacked-chip package 50-1. The second stacked-chip package 45-1 may include a first chip 100d and a second chip 200d. When the second stacked-chip package 45-1 is mounted on the first stacked-chip package 50-1, the first external connection second pad (e.g., second pad 216e2) of the first stacked-chip package 50-1 is stacked to be exposed. A second pad 216e1 for first external connection of the second stacked-chip package 45-1 is connected to the package substrate 300 using a second bonding wire 308-2.

A third stacked-chip package 50-2 is mounted on the second stacked-chip package 45-1. The third stacked-chip package 50-2 may include a first chip 100e and a second chip 200e. When the third stacked-chip package 50-2 is mounted on the second stacked-chip package 45-1, the second pad 216e1 for external connection of the second stacked-chip package 45-1 is stacked to be exposed. A second pad 216e2 for first external connection of the third stacked-chip package 50-2 is connected to the package substrate 300 using a third bonding wire 308-3.

The fourth stacked-chip package 45-2 is mounted on the third stacked-chip package 50-2. The fourth stacked-chip package 45-2 may include a first chip 100d and a second chip 200d. When the fourth stacked-chip package 45-2 is mounted on the third stacked-chip package 50-2, a first external connection second pad (e.g., second pad 216e2) of the third stacked-chip package 50-2 is stacked to be exposed. The second pad 216e1 for first external connection of the fourth stacked-chip package 45-2 is connected to the package substrate 300 using a fourth bonding wire 308-4.

The first to fourth stacked-chip packages 50-1, 45-1, 50-2 and 45-2 mounted on the package substrate 300 may be molded by a mold layer 306 to configure the stacked-chip package module 340. In the stacked-chip package module 340 of FIG. 20, only the first to fourth stacked-chip packages 50-1, 45-1, 50-2, and 45-2 are mounted on the package substrate 300, but a passive element or the like may be mounted on the package substrate 300.

Figure 21:
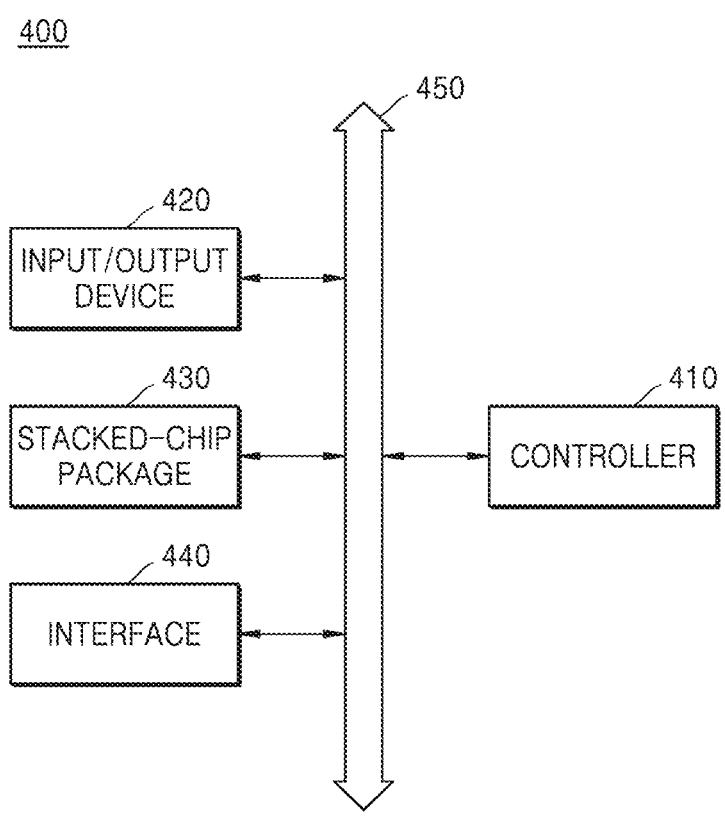
FIG. 21 is a schematic block diagram illustrating an example of a memory system including a stacked-chip package according to some example embodiments of the inventive concepts.

FIG. 21 is a schematic block diagram illustrating an example of a memory system including a stacked-chip package according to some example embodiments of the inventive concepts.

In detail, a memory system 400 may be applied to a personal digital assistant (PDA), a portable computer, a web tablet, a wireless phone, and a mobile phone, a digital music player, a memory card, or any device capable of transmitting and/or receiving information in a wireless environment.

The memory system 400 includes a controller 410, an input/output (I/O) device 420 such as a key pad, a keyboard, and a display, and a stacked-chip package 430, an interface 440, and a bus 450. The stacked-chip package 430 and the interface 440 are communicated with each other through the bus 450.

The controller 410 includes at least one microprocessor, a digital signal processor, a microcontroller, or other process devices similar thereto. The stacked-chip package 430 may be used to store commands executed by the controller 410. The input/output device 420 may receive data or signals from outside the memory system 400 or may output data or signals to the outside of the memory system 400.

The stacked-chip package 430 may include the stacked-chip package (10 to 55 of FIGS. 1 to 17) according to some example embodiments of the inventive concepts. The stacked-chip package 430 may include the stacked-chip package module (320 to 340 of FIGS. 18 to 20) of the inventive concepts described above. The stacked-chip package 430 may be a memory chip package. The memory chip package may include a volatile memory chip and/or a nonvolatile memory chip. The interface 440 serves to transmit data to a communication network or receive data from a communication network.

Figure 22:
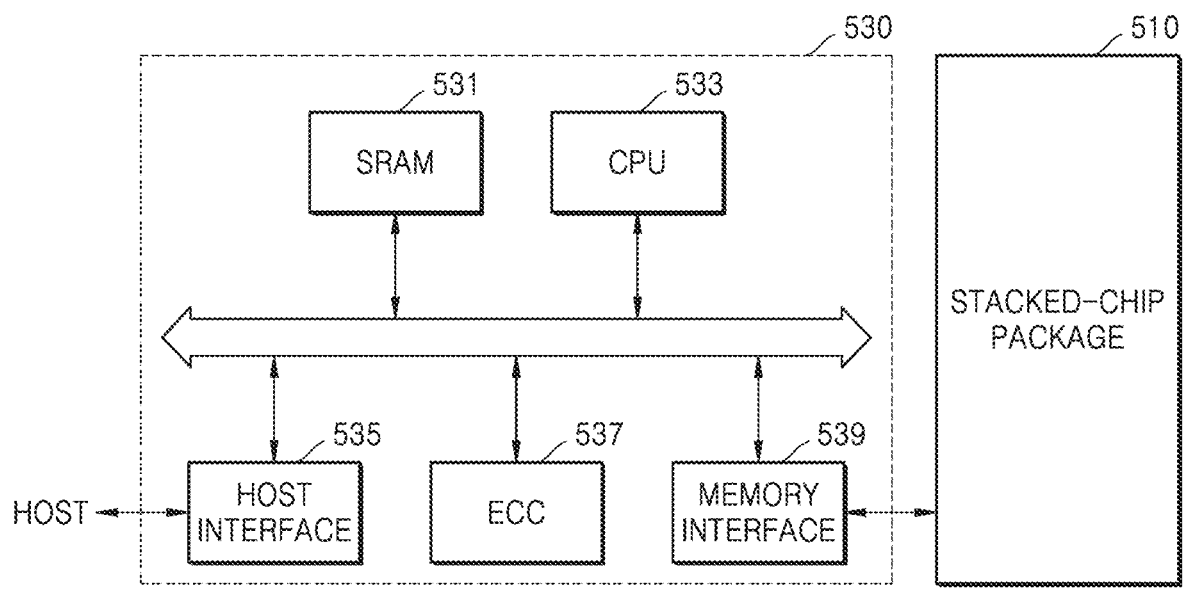
FIG. 22 is a schematic block diagram illustrating an example of a memory card including a stacked-chip package according to some example embodiments of the inventive concepts.

FIG. 22 is a schematic block diagram illustrating an example of a memory card including a stacked-chip package according to some example embodiments of the inventive concepts.

In detail, a memory card 500 for supporting a high-capacity data storage capability may mount a stacked-chip package 510 according to some example embodiments of the inventive concepts. The stacked-chip package 510 may include a stacked-chip package (10 to 55 of FIGS. 1 to 17) according to some example embodiments of the inventive concepts. The stacked-chip package 510 may include the stacked-chip package module (320 to 340 of FIGS. 18 to 20) of the inventive concepts described above. The stacked-chip package 510 may be a memory chip package. The memory chip package may include a volatile memory chip and/or a nonvolatile memory chip.

The memory card 500 includes a memory controller 530 that controls data exchange between a host and the stacked-chip package 510. A static random access memory (SRAM) 531 is used as an operation memory of the central processing unit (CPU) 533 which is a processing unit. A host interface (host I/F) 535 includes data exchange protocol of a host connected to the memory card 500. An error correction coding (ECC) block 537 detects and corrects an error included in data read from a multi-bit chip package (e.g., stacked-chip package 510) having multi-bit characteristics. The memory interface (I/F) 539 interfaces with the stacked-chip package 510.

The central processing unit 533 performs various control operations for data exchange of the memory controller 530. Although not shown in the drawings, it is obvious to those who have acquired general knowledge in this field that the memory card 500 may further be provided with a Read Only Memory (ROM, not shown) for storing code data for interfacing with the host. In particular, the memory device according to the inventive concepts may be provided to a memory system such as a solid state drive (SSD) device that has been actively progressing recently. In this case, a highly integrated memory system may be implemented.

Figure 23:
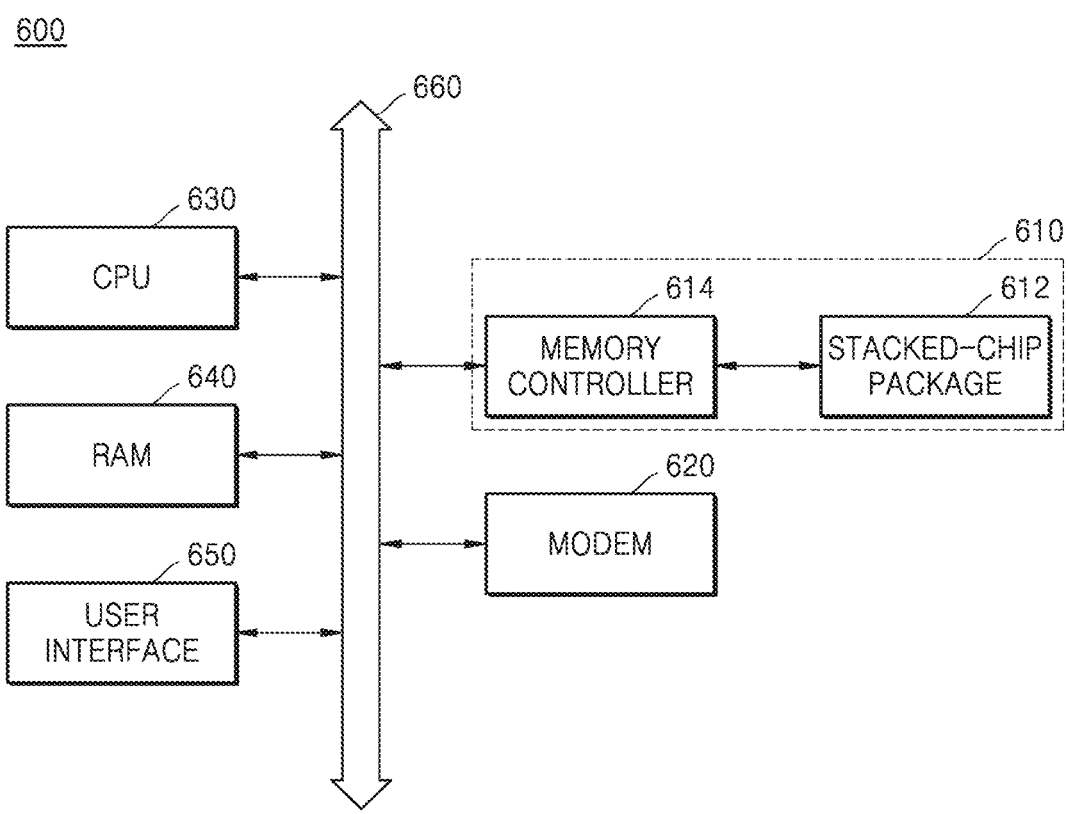
FIG. 23 is a schematic block diagram illustrating an example of an information processing system equipped with a stacked-chip package according to some example embodiments of the inventive concepts.

FIG. 23 is a schematic block diagram illustrating an example of an information processing system equipped with a stacked-chip package according to some example embodiments of the inventive concepts.

In detail, an information processing system 600 may be used in a mobile device or a desktop computer. The information processing system 600 may include a memory system 610 including a stacked-chip package 612 according to some example embodiments of the inventive concepts and a memory controller 614.

The stacked-chip package 612 may include a stacked-chip package (10 to 55 of FIGS. 1 to 17) according to some example embodiments of the inventive concepts. The stacked-chip package 612 may include the stacked-chip package module (320 to 340 of FIGS. 18 to 20) of the inventive concepts described above. The stacked-chip package 612 may be a memory chip package. The memory chip package may include a volatile memory chip and/or a nonvolatile memory chip.

The information processing system 600 includes modulator and demodulator (MODEM) 620 electrically connected to a system bus 660, a central processing unit 630, a RAM 640, and a user interface 650. Data processed by the central processing unit 630 or externally input data is stored in the memory system 610.

Here, the memory system 610 may be configured as a solid state drive. In this case, the information processing system 600 may stably store a large amount of data in the memory system 610. In addition, as reliability increases, the memory system 610 may reduce resources required for error correction, and thus provides a high-speed data exchange function to the information processing system 600.

Although not shown, it is obvious to those who have acquired general knowledge in this field that the information processing system 600 may further include an application chipset, a camera image signal processor (ISP), an input/output device, etc.

In some example embodiments, some or all of the devices and/or elements thereof as described herein with reference to any of the drawings (including without limitation any elements, units, etc. shown in any of FIGS. 5-6, 10, and 21-23) may include, may be included in, and/or may be implemented by one or more instances of processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), an application processor (AP), a microcomputer, a field programmable gate array (FPGA), and programmable logic unit, a microprocessor, application-specific integrated circuit (ASIC), a neural network processing unit (NPU), an Electronic Control Unit (ECU), and the like. In some example embodiments, the processing circuitry may include a non-transitory computer readable storage device, for example a solid state drive (SSD), storing a program of instructions, and a processor (e.g., CPU) configured to execute the program of instructions to implement the functionality of any of the elements of the devices and/or elements thereof as described herein (including without limitation any elements, units, etc. shown in any of FIGS. 5-6, 10, and 21-23).

While the inventive concepts have been particularly shown and described with reference to some example embodiments thereof, it will be understood that various changes in form and details may be made therein without departing from the spirit and scope of the following claims.

What is claimed is:

1. A stacked-chip package, comprising:
a first stacked-chip package; and
a second stacked-chip package on the first stacked-chip package,
wherein each of the first stacked-chip package and second stack-chip package includes a first chip, and a second chip stacked on the first chip,
wherein the first chip includes a first cell array region, a first core circuit region including a first core terminal, a first peripheral circuit region including a plurality of first peripheral circuit terminals, and a first through via connected to at least one first peripheral circuit terminal of the plurality of first peripheral circuit terminals, and wherein the second chip includes a second cell array region on the first cell array region, a second core circuit region on the first core circuit region and including a second core terminal, and a second through via on the first peripheral circuit region and connected to at least one first peripheral circuit terminal of the plurality of first peripheral circuit terminals.

2. The stacked-chip package of claim 1, wherein the first stacked-chip package is mounted on a substrate, and the first stacked-chip package further includes a first pad configured to establish a first external connection, and the first pad is connected to the substrate through an internal connection terminal.

3. The stacked-chip package of claim 1, wherein the plurality of first peripheral circuit terminals include a through via connection terminal connected to the first and second through vias and a first connection terminal isolated from the through via connection terminal, and the second chip further includes a second connection terminal bonded to the first connection terminal on the first peripheral circuit region.

4. The stacked-chip package of claim 3, wherein the second connection terminal is electrically connected to the second core terminal, and the first chip and the second chip share the first peripheral circuit region with each other.

5. The stacked-chip package of claim 1, wherein the first core terminal is bonded to the second core terminal.

6. The stacked-chip package of claim 1, wherein at least one separate first peripheral circuit terminal of the plurality of first peripheral circuit terminals is bonded to the second core terminal.

7. The stacked-chip package of claim 1, wherein the plurality of first peripheral circuit terminals include a through via connection terminal connected to the first and second through vias and a first connection terminal isolated from the through via connection terminal, and the first connection terminal on the first peripheral circuit region is bonded to the second core terminal.

8. The stacked-chip package of claim 1, wherein the second stacked-chip package is connected to the first stacked-chip package through a second pad configured to establish a second external connection on the second through via of the first stacked-chip package.

9. The stacked-chip package of claim 1, wherein the second chip further includes second peripheral circuit regions on the first peripheral circuit region, the second peripheral circuit regions being on opposite sides of the second through via on the first peripheral circuit region.

10. The stacked-chip package of claim 1, wherein a mold layer is further disposed to cover the first stacked-chip package and the second stacked-chip package.

11. The stacked-chip package of claim 1, wherein the first peripheral circuit region is at a central portion of the first chip, the second through via is at a central portion of the second chip, and a center pad for external connection is on the second through via at the central portion of the second chip.

12. The stacked-chip package of claim 1, wherein each of the first and second through vias is a single body connecting the first chip to the second chip.

13. A stacked-chip package comprising:
a first stacked-chip package; and
a second stacked-chip package on the first stacked-chip package, wherein each of the first stacked-chip package and second stack-chip package includes a first chip; and a second chip stacked on the first chip, wherein the first chip includes
a first substrate having a first surface and a second surface opposite to the first surface,
a first cell array region on the first surface of the first substrate,
a first core circuit region adjacent to the first cell array region, the first core circuit region including a first core terminal,
a first peripheral circuit region adjacent to the first core circuit region, the first peripheral circuit region including a first peripheral circuit terminal, and
a first through via penetrating the first substrate, the first through via being electrically connected to the first peripheral circuit terminal, and wherein the second chip includes
a second substrate having a third surface and a fourth surface opposite to the third surface,
a second cell array region on the third surface of the second substrate, the second cell array region being on the first cell array region,
a second core circuit region on the first core circuit region, the second core circuit region including a second core terminal, and
a second through via on the first peripheral circuit region, the second through via penetrating the second substrate, the second through via being electrically connected to the first peripheral circuit terminal.

14. The stacked-chip package of claim 13, wherein the first core terminal is bonded to the second core terminal.

15. The stacked-chip package of claim 13, wherein the first peripheral circuit terminal includes a through via connection terminal connected to the first and second through vias, the first peripheral circuit region further includes a first connection terminal isolated from the first and second through vias, and the second chip further includes a second connection terminal bonded to the first connection terminal on the first peripheral circuit region.

16. The stacked-chip package of claim 15, wherein the first stacked-chip package is mounted on a substrate, and the first stacked-chip package further includes a first pad configured to establish a first external connection, and the first pad is connected to the first through via of the first stacked-chip package.

17. The stacked-chip package of claim 13, wherein the second chip further includes second peripheral circuit regions on the first peripheral circuit region, the second peripheral circuit regions being on opposite sides of the second through via on the first peripheral circuit region.

18. A stacked-chip package comprising:
a first stacked-chip package on a substrate;
a second stacked-chip package on the first stacked-chip package; and
a mold to cover the first and second stacked-chip packages, wherein each of the first stacked-chip package and second stack-chip package includes a first chip, and a second chip stacked on the first chip, wherein the first chip includes
a first substrate having a first surface and a second surface opposite to the first surface,
a first cell array region on the first surface of the first substrate, a first core circuit region adjacent to the first cell array region, the first core circuit region including a first core terminal, a first peripheral circuit region adjacent to the first core circuit region, the first peripheral circuit region including a first peripheral circuit terminal, and a first through via penetrating the first substrate and connected to the first peripheral circuit terminal, and wherein the second chip includes a second substrate having a third surface and a fourth surface opposite to the third surface, a second cell array region on the third surface of the second substrate, the second cell array region being on the first cell array region, a second core circuit region on the first core circuit region, the second core circuit region including a second core terminal, and a second through via on the first peripheral circuit region, the second through via penetrating the second substrate, the second through via electrically connected to the first peripheral circuit terminal.

19. The stacked-chip package of claim 18, further comprising:

at least one of a first pad configured to establish a first external connection, the first pad on the second surface and connected to the first through via, or a second pad configured to establish a second external connection, the second pad being on the fourth surface and connected to the second through via.

20. The stacked-chip package of claim 18, wherein the second chip further includes second peripheral circuit regions on the first peripheral circuit region, the second peripheral circuit regions being on opposite sides of the second through via on the first peripheral circuit region.

* * * * *